US012526985B2

United States Patent
Sharma et al.

(10) Patent No.: US 12,526,985 B2
(45) Date of Patent: Jan. 13, 2026

(54) BACK-SIDE REVEAL FOR POWER DELIVERY TO BACKEND MEMORY WITH FRONTEND TRANSISTORS AND BACKEND MEMROY CELLS

(71) Applicant: Intel Corporation, Santa Clara, CA (US)

(72) Inventors: Abhishek A. Sharma, Hillsboro, OR (US); Wilfred Gomes, Portland, OR (US); Van H. Le, Beaverton, OR (US); Kimin Jun, Portland, OR (US); Hui Jae Yoo, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 1004 days.

(21) Appl. No.: 17/355,449

(22) Filed: Jun. 23, 2021

(65) Prior Publication Data

US 2022/0415904 A1    Dec. 29, 2022

(51) Int. Cl.
*H10B 12/00* (2023.01)
*H01L 23/00* (2006.01)
(Continued)

(52) U.S. Cl.
CPC .............. *H10B 12/50* (2023.02); *H01L 24/29* (2013.01); *H01L 24/32* (2013.01); *H01L 24/83* (2013.01); *H01L 25/0657* (2013.01); *H01L 25/50* (2013.01); *H10B 12/02* (2023.02); *H10B 12/31* (2023.02); *H01L 2224/29187* (2013.01); *H01L 2224/32146* (2013.01); *H01L 2924/1436* (2013.01)

(58) Field of Classification Search
CPC ........ H10B 12/02; H10B 12/31; H10B 12/50; H10B 12/05; H10B 12/29; H10B 12/32; H01L 23/5226; H01L 23/481; H01L 23/49816; H01L 23/5283; H01L 23/5285; H01L 23/5286
See application file for complete search history.

(56) References Cited

U.S. PATENT DOCUMENTS 11,018,264 B1    5/2021  Gomes et al.
11,239,208 B2 *  2/2022  Chuang ............ H01L 29/78618
(Continued)

OTHER PUBLICATIONS

U.S. Appl. No. 16/667,740, filed Oct. 29, 2019, Thin Film Transistor Based Memory Cells on Both Sides of a Layer of Logic Devices.
(Continued)

*Primary Examiner* — Khiem D Nguyen
(74) *Attorney, Agent, or Firm* — Akona IP PC

(57) ABSTRACT

Embodiments of the present disclosure provide power to backend memory of an IC device from the back side of the device. An example IC device with back-side power delivery for backend memory includes a frontend layer with a plurality of frontend components such as frontend transistors, a backend layer (that may include a plurality of layers) with backend memory (e.g., with one or more eDRAM arrays), and a back-side power delivery structure with a plurality of back-side interconnects electrically coupled to the backend memory, where the frontend layer is between the back-side power delivery structure and the backend layer.

20 Claims, 16 Drawing Sheets

(51) Int. Cl.
*H01L 25/00* (2006.01)
*H01L 25/065* (2023.01)

(56) References Cited

U.S. PATENT DOCUMENTS

| | | | |
|---|---|---|---|
| 11,239,238 B2* | 2/2022 | Gomes | H01L 24/83 |
| 11,264,388 B2* | 3/2022 | Wang | H01L 23/5223 |
| 2020/0203329 A1* | 6/2020 | Kanamori | H01L 24/09 |
| 2020/0286842 A1* | 9/2020 | Sanuki | H01L 24/09 |
| 2020/0411078 A1* | 12/2020 | Sharma | H10B 12/315 |
| 2021/0125990 A1 | 4/2021 | Gomes et al. | |
| 2021/0134802 A1 | 5/2021 | Gomes et al. | |
| 2021/0151438 A1 | 5/2021 | Gomes et al. | |
| 2021/0159229 A1 | 5/2021 | Gomes et al. | |
| 2022/0359758 A1* | 11/2022 | Madisetti | H01L 29/7869 |

OTHER PUBLICATIONS

U.S. Appl. No. 16/669,599, filed Oct. 31, 2019, Transistors With Back-Side Contacts to Create Three Dimensional Memory and Logic.
U.S. Appl. No. 16/689,789, filed Nov. 20, 2019, Three-Dimensional Memory Arrays With Layer Selector Transistors.
U.S. Appl. No. 16/691,163, filed Nov. 21, 2019, Three-Dimensional Nanoribbon-Based Dynamic Random-Access Memory.
U.S. Appl. No. 16/715,135, filed Dec. 16, 2019, Three-Dimensional Nanoribbon-Based Logic.
U.S. Appl. No. 16/724,691, filed Dec. 23, 2019, Dense Memory Arrays Utilizing Access Transistors With Back-Side Contacts.
U.S. Appl. No. 16/806,283, filed Mar. 2, 2020, Three-Dimensional Nanoribbon-Based Static Random-Access Memory.
U.S. Appl. No. 16/884,524, filed May 27, 2020, Three-Dimensional Nanoribbon-Based Two-Transistor Memory Cells.
U.S. Appl. No. 17/114,537, filed Dec. 8, 2020, Hybrid Manufacturing for Integrated Circuit Devices and Assemblies.
U.S. Appl. No. 17/114,700, filed Dec. 8, 2020, Hybrid Manufacturing for Integrated Circuit Devices and Assemblies.
U.S. Appl. No. 17/123,787, filed Dec. 16, 2020, Hybrid Manufacturing for Integrating Photonic and Electronic Components.
U.S. Appl. No. 17/210,836, filed Mar. 24, 2021, Integrated Circuit Assemblies.
U.S. Appl. No. 17/197,659, filed Mar. 10, 2021, Stacked Vias With Bottom Portions Formed Using Selective Growth.
U.S. Appl. No. 17/210,682, filed Mar. 24, 2021, Integrated Circuit Assemblies With Direct Chip Attach to Circuit Boards.
U.S. Appl. No. 17/241,374, filed Apr. 27, 2021, Back-Side Power Delivery With Glass Support at the Front.
U.S. Appl. No. 17/323,425, filed May 18, 2021, Three-Dimensional Monolithically Integrated Nanoribbon-Based Memory and Compute.
U.S. Appl. No. 17/325,617, filed May 20, 2021, Thin-Film Transistor Memory With Glass Support at the Back.
U.S. Appl. No. 17/345,369, filed Jun. 11, 2021, Hybrid Manufacturing With Modified Via-Last Process.
U.S. Appl. No. 17/342,144, filed Jun. 8, 2021, Stacked Backend Memory With Resistive Switching Devices.
U.S. Appl. No. 17/351,301, filed Jun. 18, 2021, Stacked Backend Memory With Resistive Switching Devices.

* cited by examiner

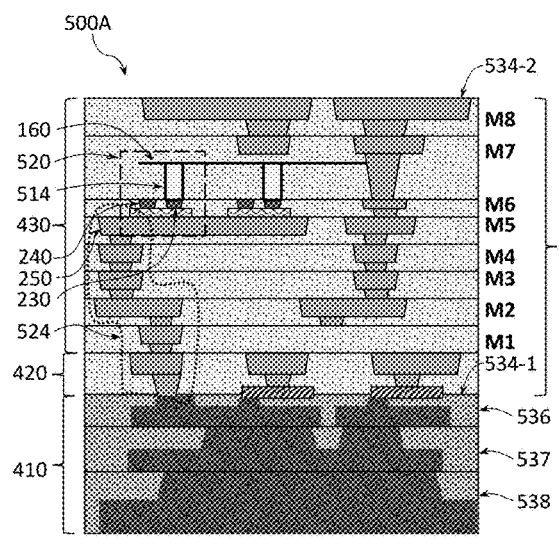
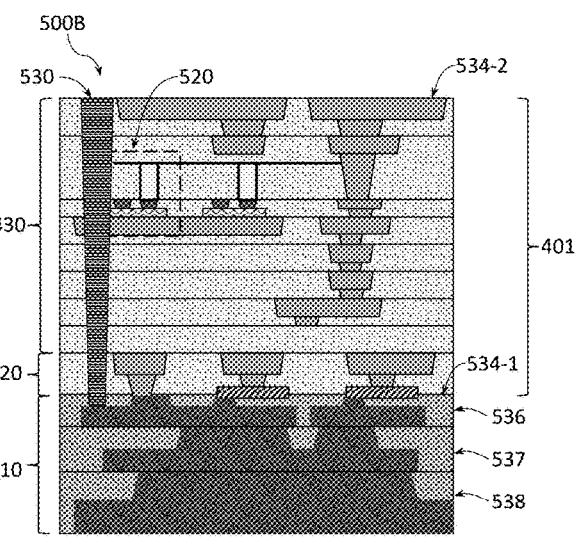
FIG. 5A   FIG. 5B
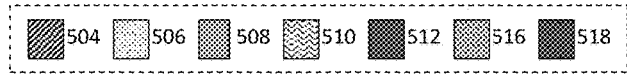

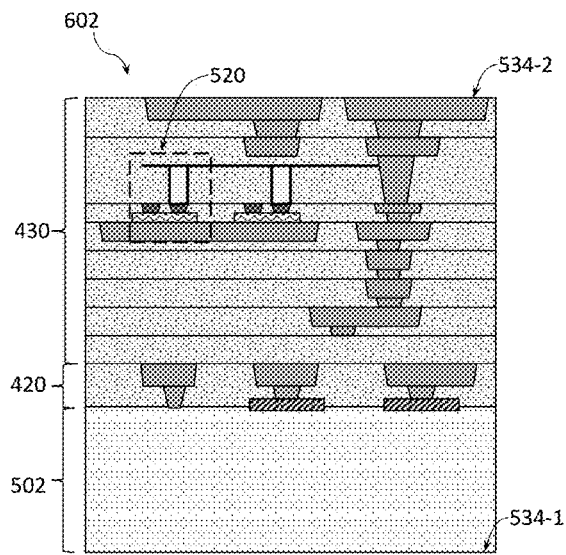
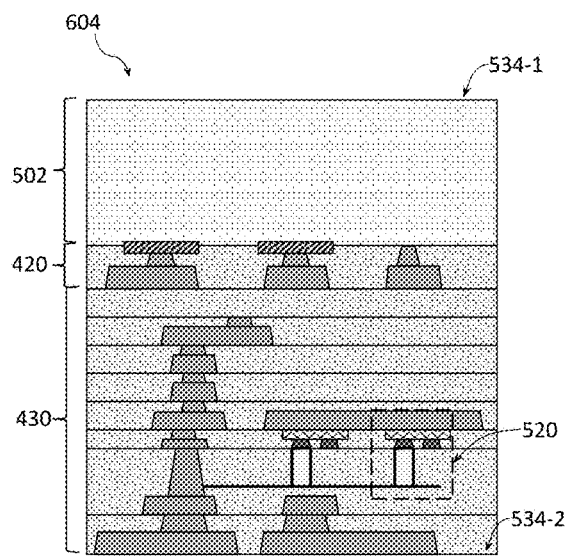
FIG. 6A
FIG. 6B
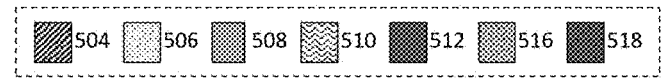

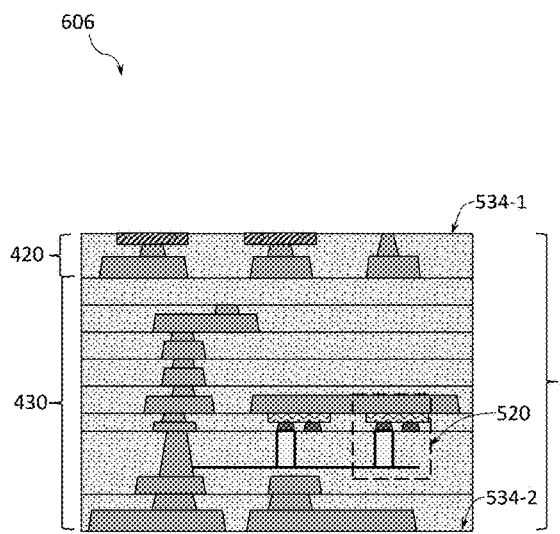
FIG. 6C
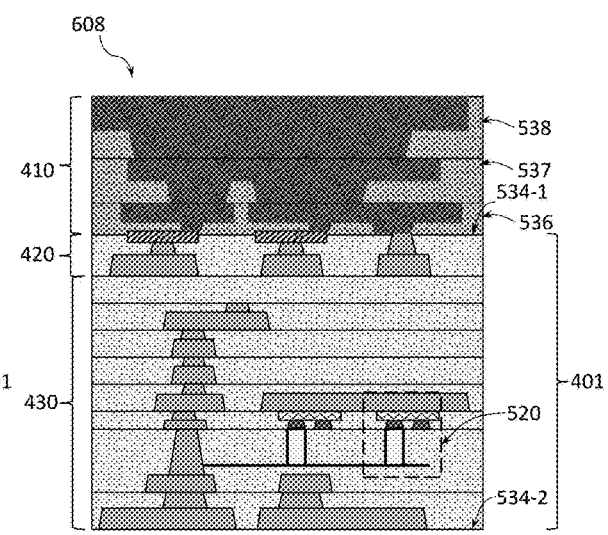
FIG. 6D
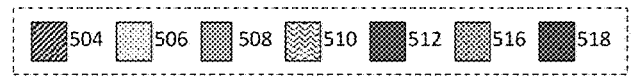

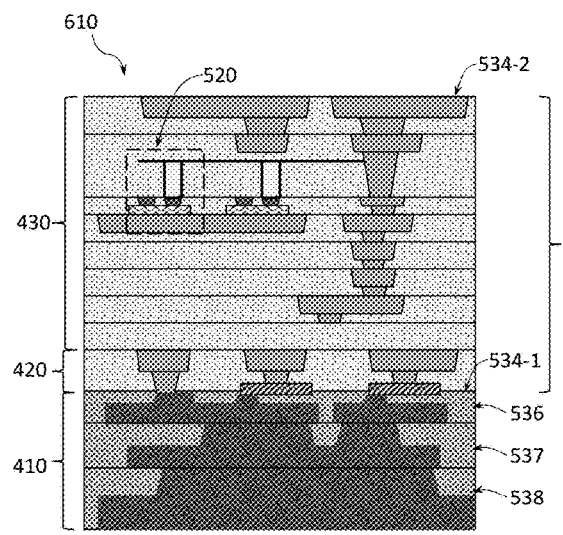
FIG. 6E
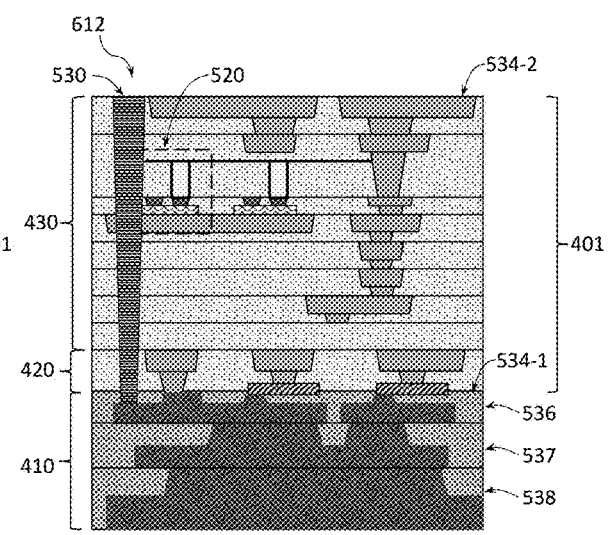
FIG. 6F
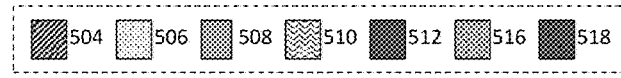

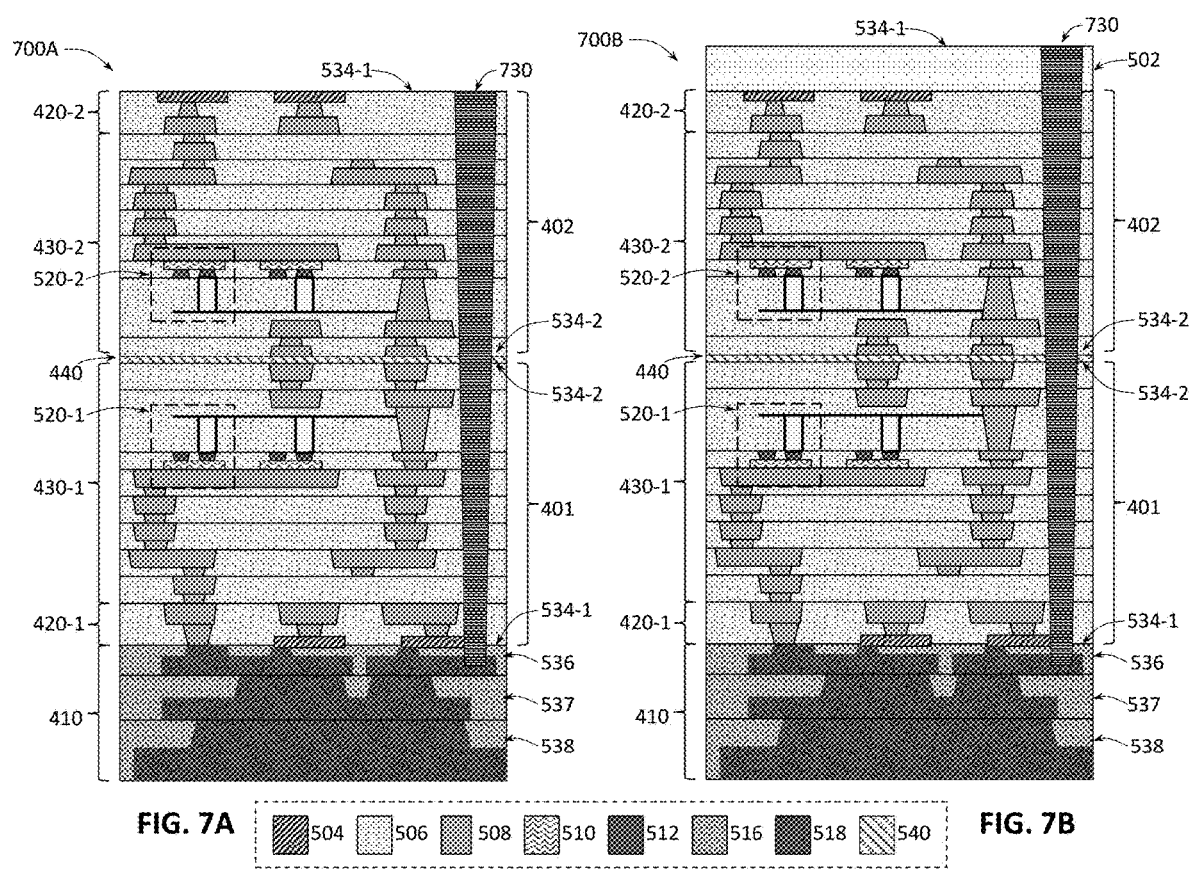

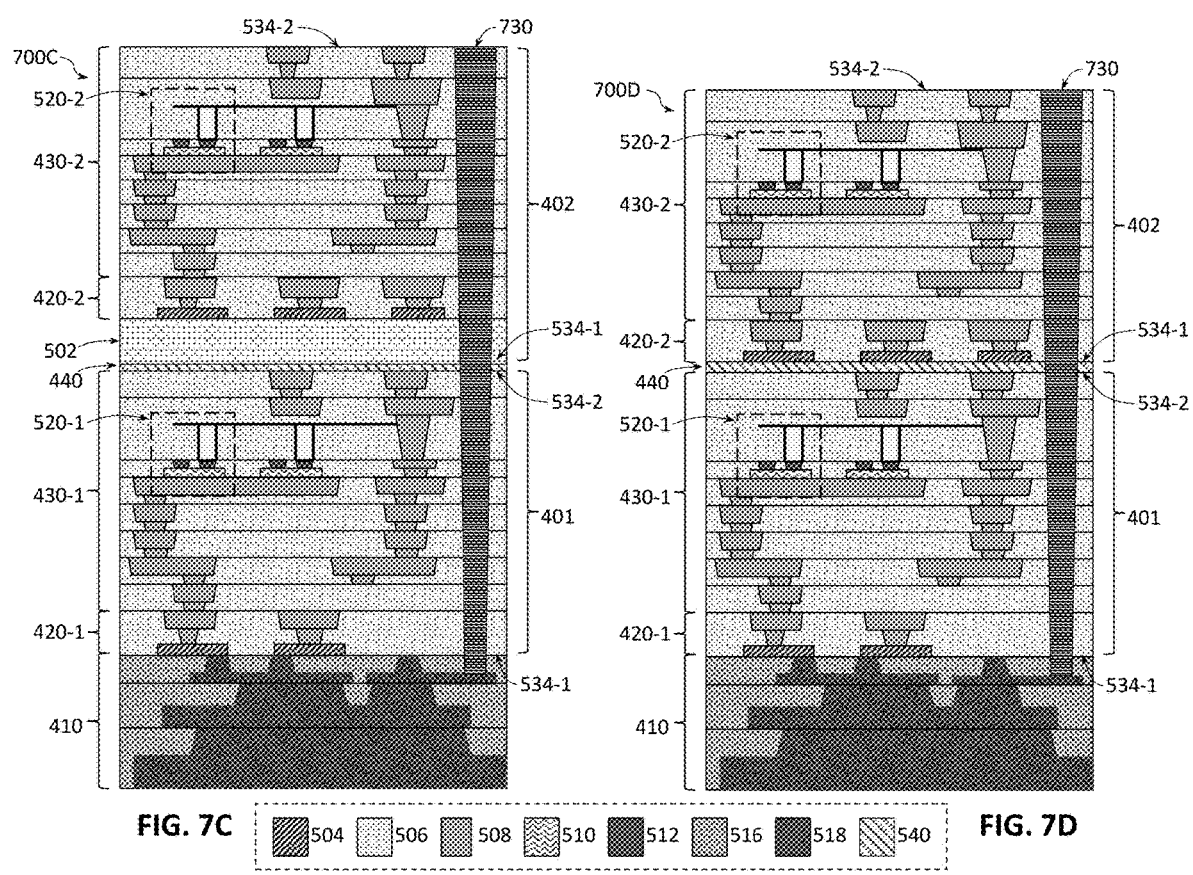

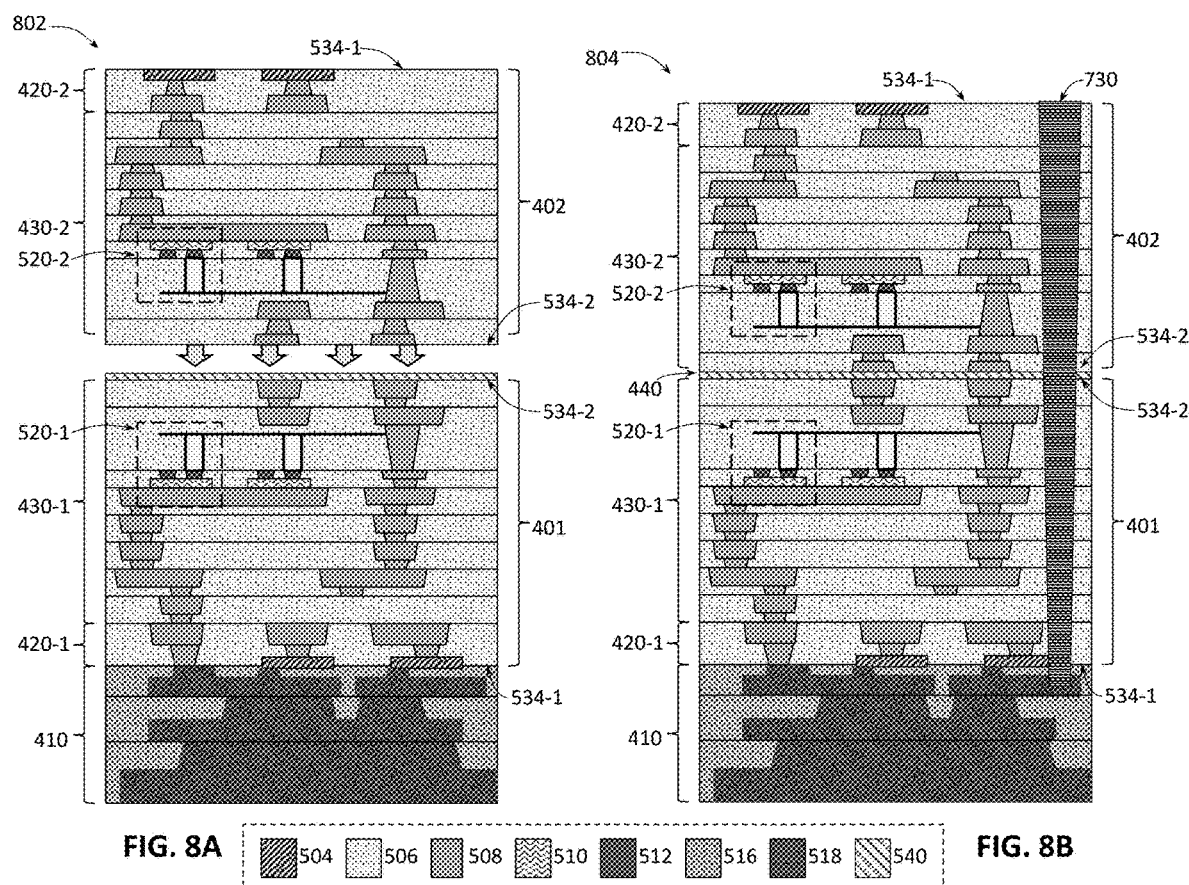

BACK-SIDE REVEAL FOR POWER DELIVERY TO BACKEND MEMORY WITH FRONTEND TRANSISTORS AND BACKEND MEMROY CELLS

BACKGROUND

Embedded memory is important to the performance of modern system-on-a-chip (SoC) technology. Low power and high density embedded memory is used in many different computer products and further improvements are always desirable.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, and not by way of limitation, in the figures of the accompanying drawings.

FIGS. 5A-5B provide cross-sectional views of example IC devices with a single IC structure with back-side reveal for power delivery to backend memory, according to various embodiments of the present disclosure.

FIGS. 6A-6F provide cross-sectional side views at different stages of fabricating an IC device with a single IC structure with back-side reveal for power delivery to backend memory, according to some embodiments of the present disclosure.

FIGS. 7A-7D provide cross-sectional views of example IC devices with multiple IC structures bonded together and with back-side reveal for power delivery to backend memory, according to various embodiments of the present disclosure.

FIGS. 8A-8B provide cross-sectional side views at different stages of fabricating an IC device with multiple IC structures bonded together and with back-side reveal for power delivery to backend memory, according to some embodiments of the present disclosure.

DETAILED DESCRIPTION

Overview

Figure 1:
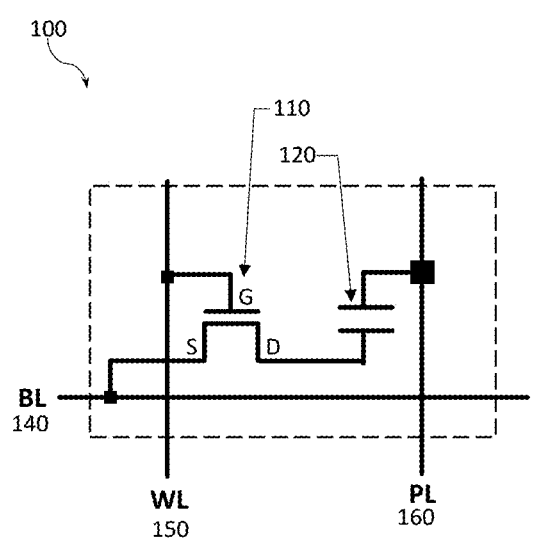
FIG. 1 provides an electric circuit diagram of a one access transistor (1T) and one capacitor (1C) (1T-1C) memory cell, according to some embodiments of the present disclosure.

The systems, methods and devices of this disclosure each have several innovative aspects, no single one of which is solely responsible for all of the desirable attributes disclosed herein. Details of one or more implementations of the subject matter described in this specification are set forth in the description below and the accompanying drawings.

For purposes of illustrating IC devices with back-side reveal for power delivery to backend memory as described herein, it might be useful to first understand phenomena that may come into play in certain IC arrangements. The following foundational information may be viewed as a basis from which the present disclosure may be properly explained. Such information is offered for purposes of explanation only and, accordingly, should not be construed in any way to limit the broad scope of the present disclosure and its potential applications.

Some memory devices may be considered "standalone" devices in that they are included in a chip that does not also include compute logic (where, as used herein, the term "compute logic devices" or simply "compute logic" or "logic devices," refers to IC components, e.g., transistors, for performing computing/processing operations). Other memory devices may be included in a chip along with compute logic and may be referred to as "embedded" memory devices. Using embedded memory to support compute logic may improve performance by bringing the memory and the compute logic closer together and eliminating interfaces that increase latency. Various embodiments of the present disclosure relate to embedded memory arrays, as well as corresponding methods and devices.

Some embodiments of the present disclosure may refer to dynamic random-access memory (DRAM) and in particular, embedded DRAM (eDRAM), because this type of memory has been introduced in the past to address the limitation in density and standby power of other types or memory. However, embodiments of the present disclosure are equally applicable to backed memory implemented using other technologies. Thus, in general, backend memory described herein may be implemented as eDRAM cells, spin-transfer torque random-access memory (STTRAM) cells, resistive random-access memory (RRAM) cells, or any other non-volatile memory cells.

As an example, a DRAM cell may include a capacitor for storing a bit value, or a memory state (e.g., logical "1" or "0") of the cell, and an access transistor controlling access to the cell (e.g., access to write information to the cell or access to read information from the cell). Such a memory cell may be referred to as a "1T-1C memory cell," highlighting the fact that it uses one transistor (i.e., "1T" in the term "1T-1C memory cell") and one capacitor (i.e., "1C" in the term "1T-1C memory cell"). The capacitor of a 1T-1C memory cell may be coupled to one source or drain (S/D) terminal/region of the access transistor (e.g., to the source terminal/region of the access transistor), while the other S/D terminal/region of the access transistor (e.g., to the drain terminal/region) may be coupled to a bit-line (BL), and a gate terminal of the transistor may be coupled to a word-line (WL). Since such a memory cell can be fabricated with as little as a single access transistor, it can provide higher density and lower standby power versus some other types of memory in the same process technology.

Various 1T-1C memory cells have, conventionally, been implemented with access transistors being front end of line (FEOL), logic-process based, transistors implemented in an upper-most layer of a semiconductor substrate (such transistors may be referred to as "frontend transistors" or "FEOL transistors"). However, using standard logic transistors as access transistors of 1T-1C memory cells creates several challenges.

One challenge relates to the leakage of an access transistor, i.e., current flowing between the source and the drain of a transistor when the transistor is in an "off" state. Since reducing leakage of logic transistors in the scaled technology is difficult, implementing 1T-1C memory in advanced technology nodes (e.g., 10 nanometer (nm), 7 nm, 5 nm, and beyond) can be challenging. In particular, given a certain access transistor leakage, capacitance of the capacitor of a 1T-1C memory cell should be large enough so that sufficient charge can be stored on the capacitor to meet the corresponding refresh times. However, continuous desire to decrease size of electronic components dictates that the macro area of memory arrays continues to decrease, placing limitations on how large the top area (i.e., the footprint) of a given capacitor is allowed to be, which means that capacitors need to be taller in order to have both sufficiently small footprint area and sufficiently large capacitance. As the capacitor dimensions continue to scale, this in turn creates a challenge for etching the openings for forming the capacitors as tall capacitors with small footprint areas require higher aspect ratio openings, something which is not easy to achieve.

Another challenge associated with the use of logic transistors in 1T-1C memory cells relates to the location of the capacitors such memory cells. Namely, it may be desirable to provide capacitors in metal layers close to their corresponding access transistors. Since logic transistors are implemented as frontend transistors provided directly on the semiconductor substrate, the corresponding capacitors of 1T-1C memory cells then have to be embedded in lower metal layers in order to be close enough to the logic access transistors. As the pitches of lower metal layers aggressively scale in advanced technology nodes, embedding the capacitors in the lower metal layers poses significant challenges to the scaling of 1T-1C based memory.

Yet another challenge resides in that, given a usable surface area of a substrate, there are only so many frontend transistors that can be formed in that area, placing a significant limitation on the density of memory cells of a memory array.

Implementing memory in the backend of an IC device, i.e., in a back end of line (BEOL) layer that may include one or more interconnect layers (also referred to as "metal layers") may address some of the challenges described above.

Backend memory may be implemented using TFTs as access transistors of the memory cells embedded in the BEOL layer. A TFT is a special kind of a field-effect transistor made by depositing a thin film of an active semiconductor material, as well as a dielectric layer and metallic contacts, over a supporting layer that may be a non-conducting layer and a non-semiconductor layer. At least a portion of the active semiconductor material forms a channel of the TFT. This is different from conventional, non-TFT, FEOL logic transistors where the active semiconductor channel material is typically a part of a semiconductor substrate, e.g., a part of a silicon wafer. Using TFTs as access transistors of memory cells provides several advantages and enables unique architectures that were not possible with conventional, FEOL logic transistors. For example, one advantage is that a TFT may have substantially lower leakage than a logic transistor, allowing to relax the demands on the large capacitance placed on a capacitor of a 1T-1C memory cell. In other words, using a lower leakage TFT in a 1T-1C memory cell allows the memory cell to use a capacitor with lower capacitance and smaller aspect ratio while still meeting the same data retention requirements of other approaches, alleviating the scaling challenges of capacitors.

Additionally, or alternatively, to TFT-based memory, backend memory may be implemented using layer transfer to form access transistors of the memory cells embedded in the BEOL layer. Layer transfer may include epitaxially growing a layer of a highly crystalline semiconductor material on another substrate and then transferring the layer, or a portion thereof, to embed it in the BEOL layer provided over a second substrate. Channel regions of backend transistors then include at least portions of such transferred semiconductor material layer. Performing layer transfer may advantageously allow forming non-planar transistors, such as FinFETs, nanowire transistors, or nanoribbon transistors, in the BEOL layer. In some embodiments, transistors, or portions thereof (e.g., S/D regions) may be formed on the first substrate (i.e., on the substrate on which a layer of a highly crystalline semiconductor material is grown) before the layer transfer takes place, and then a layer with such transistors, or portions thereof, is transferred.

Layer transfer approach for providing backend memory may be particularly suitable for forming access transistors with channel regions formed of substantially single-crystalline semiconductor materials. On the other hand, TFT-based backend memory may be seen as an example of a monolithic integration approach because the semiconductor materials for the channel regions are deposited in a BEOL layer of an IC device, as opposed to being epitaxially grown elsewhere and then transferred, which may be particularly suitable for forming access transistors with channels formed of polycrystalline, polymorphous, or amorphous semiconductor materials, or various other thin-film channel materials. Whether a semiconductor material of a channel region for a given backend device (e.g., a backend transistor) has been provided by monolithic integration approach or by layer transfer can be identified by inspecting grain size of active semiconductor material of the device (e.g., of the semiconductor material of the channel region of a backend transistor). An average grain size of the semiconductor material being between about 0.5 and 1 millimeters (in which case the material may be polycrystalline) or smaller than about 0.5 millimeter (in which case the material may be polymorphous) may be indicative of the semiconductor material having been deposited in the BEOL layer of the device (i.e., monolithic integration approach), e.g., to form a TFT. On the other hand, an average grain size of the semiconductor material being equal to or greater than about 1 millimeter (in which case the material may be a single-crystal material) may be indicative of the semiconductor material having been included in the BEOL layer of the device by layer transfer. The discussions of monolithic integration vs. layer transfer approaches for forming backend memory are equally applicable to backend transistors that are not part of a memory array (e.g., if backend transistors are implemented in an IC device to serve as logic transistors, switches, or for any other purposes or in any other circuits).

Moving access transistors to the BEOL layer of an advanced complementary metal oxide semiconductor (CMOS) process, either by monolithic integration (e.g., using TFTs) or by layer transfer, means that their corresponding capacitors can be implemented in the upper metal layers with correspondingly thicker interlayer dielectric (ILD) and larger metal pitch to achieve higher capacitance. This eases the integration challenge introduced by embedding the capacitors. Furthermore, when at least some access transistors are implemented as backend transistors, at least portions of different memory cells may be provided in different layers of a BEOL layer above a substrate, thus enabling a stacked architecture of memory arrays. In this context, the term "above" refers to a layer in the BEOL layer being further away from the FEOL layer of an IC device (e.g., the IC device 400 shown in FIGS. 4A-4C).

Providing power to various components implemented in the backend, e.g., to access transistors of backend memory, is not an easy task. Conventionally, power is provided from the front side of an IC device, i.e., a face of the IC device that is above the BEOL layer so that the BEOL layer is between said front side and the FEOL layer. In contrast to such conventional implementations, embodiments of the present disclosure provide power to backend memory from the back side of an IC device, i.e., from a face of the IC device that is opposite the front side. Such embodiments are based on performing back-side reveal to remove some or all of the support structure over which the FEOL components (e.g., frontend transistors) were formed and then providing one or more layers of interconnects for routing power at the revealed back side. Providing power to backend memory from the back side of an IC device may provide advantages in terms of, e.g., easier fabrication and decreased complexity of power routing. Furthermore, when back-side power delivery is implemented, besides interconnects for delivering power, a back-side power delivery structure may include various IC components (e.g., capacitors, inductors, resistors, etc.) for reducing the parasitic effects of the assembly, e.g., for reducing parasitic effects associated with the interconnects used for power delivery. An example IC device with back-side power delivery for backend memory may include an FEOL layer with a plurality of FEOL components such as frontend transistors, a BEOL layer (that may include a plurality of layers) with backend memory (e.g., with one or more eDRAM arrays), and a back-side power delivery structure with a plurality of back-side interconnects electrically coupled to (e.g., in electrically conductive contact with at least portions of) various ones of the plurality of FEOL components and the backend memory, where the FEOL layer is between the back-side power delivery structure and the BEOL layer.

While some descriptions are provided herein with respect to the back-side structure being used for power delivery to backend memory, these descriptions are equally applicable if the back-side structure as described herein is used for communicating signals to/from the backend memory or if the back-side structure as described herein is used for providing control commands to/from the backend memory. Thus, all descriptions referring to back-side power delivery are equally applicable to back-side signal/control command communications to/from the backend memory, all of such embodiments being within the scope of the present disclosure.

In the following, some descriptions may refer to backend memory being TFT-based memory. However, embodiments of the present disclosure are equally applicable to backend memory implemented using layer transfer instead of, or in addition to, TFTs.

Furthermore, some descriptions may refer to a particular S/D region or contact of a transistor being either a source region/contact or a drain region/contact. However, unless specified otherwise, which region/contact of a transistor is considered to be a source region/contact and which region/contact is considered to be a drain region/contact is not important because, as is common in the field of field-effect transistors (FETs), designations of source and drain are often interchangeable. Therefore, descriptions of some illustrative embodiments of the source and drain regions/contacts provided herein are applicable to embodiments where the designation of source and drain regions/contacts may be reversed. Unless explained otherwise, in some settings, the terms S/D region, S/D contact, and S/D terminal of a transistor may be used interchangeably, although, in general, the term "S/D contact" is used to refer to an electrically conductive structure for making a contact to a S/D region of a transistor, while the term "S/D terminal" may generally refer to either S/D region or S/D contact of a transistor.

Still further, while some descriptions provided herein may refer to transistors being bottom-gated transistors, embodiments of the present disclosure are not limited to only this design and include transistors of various other architectures, or a mixture of different architectures. For example, in various embodiments, transistors described herein, may include bottom-gated transistors, top-gated transistors, FinFETs, nanowire transistors, nanoribbon transistors, planar transistors, etc., all of which being within the scope of the present disclosure. Furthermore, although descriptions of the present disclosure may refer to logic devices or memory cells provided in a given layer of an IC device, each layer of the IC devices described herein may also include other types of devices besides logic or memory devices described herein. For example, in some embodiments, FEOL layers with logic transistors may also include memory cells and/or BEOL layers with memory cells may also include logic transistors. In general, a FEOL layer may include one or more layers, each including frontend components and/or interconnects, and a BEOL layer may include one or more layers, each including backend components (e.g., backend memory) and/or interconnects.

In the following detailed description, various aspects of the illustrative implementations will be described using terms commonly employed by those skilled in the art to convey the substance of their work to others skilled in the art. For example, a term "interconnect" may be used to describe any element formed of an electrically conductive material for providing electrical connectivity to one or more components associated with an IC or/and between various such components. In general, the term "interconnect" may refer to both conductive lines (or, simply, "lines," also sometimes referred to as "traces" or "trenches") and conductive vias (or, simply, "vias"). In general, in context of interconnects, the term "conductive line" may be used to describe an electrically conductive element isolated by an insulator material (e.g., a low-k dielectric material) that is provided within the plane of an IC die. Such lines are typically stacked into several levels, or several layers, of a metallization stack. On the other hand, the term "via" may be used to describe an electrically conductive element that interconnects two or more lines of different levels. To that end, a via may be provided substantially perpendicularly to the plane of an IC die and may interconnect two lines in adjacent levels or two lines in not adjacent levels. A term "metallization stack" may be used to refer to a stack of one or more interconnects for providing connectivity to different circuit components of an IC chip. Sometimes, lines and vias may be referred to as "metal traces" and "metal vias", respectively, to highlight the fact that these elements include electrically conductive materials such as metals.

In another example, the terms "package" and "IC package" are synonymous, as are the terms "die" and "IC die," the term "insulating" means "electrically insulating," the term "conducting" means "electrically conducting," unless otherwise specified. Although certain elements may be referred to in the singular herein, such elements may include multiple sub-elements. For example, "an electrically conductive material" may include one or more electrically conductive materials. If used, the terms "oxide," "carbide," "nitride," etc. refer to compounds containing, respectively, oxygen, carbon, nitrogen, etc., the term "high-k dielectric" refers to a material having a higher dielectric constant than silicon oxide, while the term "low-k dielectric" refers to a material having a lower dielectric constant than silicon oxide. Furthermore, the term "connected" may be used to describe a direct electrical or magnetic connection between the things that are connected, without any intermediary devices, while the term "coupled" may be used to describe either a direct electrical or magnetic connection between the things that are connected, or an indirect connection through one or more passive or active intermediary devices. The term "circuit" may be used to describe one or more passive and/or active components that are arranged to cooperate with one another to provide a desired function. The terms "substantially," "close," "approximately," "near," and "about," generally refer to being within +/−20% of a target value based on the context of a particular value as described herein or as known in the art. Similarly, terms indicating orientation of various elements, e.g., "coplanar," "perpendicular," "orthogonal," "parallel," or any other angle between the elements, generally refer to being within +/−5-20% of a target value based on the context of a particular value as described herein or as known in the art.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). The term "between," when used with reference to measurement ranges, is inclusive of the ends of the measurement ranges. As used herein, the notation "A/B/C" means (A), (B), and/or (C).

The description may use the phrases "in an embodiment" or "in embodiments," which may each refer to one or more of the same or different embodiments. Furthermore, the terms "comprising," "including," "having," and the like, as used with respect to embodiments of the present disclosure, are synonymous. The disclosure may use perspective-based descriptions such as "above," "below," "top," "bottom," and "side"; such descriptions are used to facilitate the discussion and are not intended to restrict the application of disclosed embodiments. The accompanying drawings are not necessarily drawn to scale. Unless otherwise specified, the use of the ordinal adjectives "first," "second," and "third," etc., to describe a common object, merely indicate that different instances of like objects are being referred to and are not intended to imply that the objects so described must be in a given sequence, either temporally, spatially, in ranking or in any other manner.

In the following detailed description, reference is made to the accompanying drawings that form a part hereof, and in which is shown, by way of illustration, embodiments that may be practiced. It is to be understood that other embodiments may be utilized, and structural or logical changes may be made without departing from the scope of the present disclosure. Therefore, the following detailed description is not to be taken in a limiting sense. For convenience, if a collection of drawings designated with different letters are present, e.g., FIGS. 4A-4C, such a collection may be referred to herein without the letters, e.g., as "FIG. 4." In order to not clutter the drawings, sometimes only one instance of a given element is labeled in a drawing with a reference numeral, although other similar elements may be shown.

In the drawings, some schematic illustrations of example structures of various devices and assemblies described herein may be shown with precise right angles and straight lines, but it is to be understood that such schematic illustrations may not reflect real-life process limitations which may cause the features to not look so "ideal" when any of the structures described herein are examined using e.g., scanning electron microscopy (SEM) images or transmission electron microscope (TEM) images. In such images of real structures, possible processing defects could also be visible, e.g., not-perfectly straight edges of materials, tapered vias or other openings, inadvertent rounding of corners or variations in thicknesses of different material layers, occasional screw, edge, or combination dislocations within the crystalline region, and/or occasional dislocation defects of single atoms or clusters of atoms. There may be other defects not listed here but that are common within the field of device fabrication.

Various operations may be described as multiple discrete actions or operations in turn in a manner that is most helpful in understanding the claimed subject matter. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments.

Various IC devices with back-side reveal for power delivery to backend memory as described herein may be implemented in, or associated with, one or more components associated with an IC or/and may be implemented between various such components. In various embodiments, components associated with an IC include, for example, transistors, diodes, power sources, resistors, capacitors, inductors, sensors, transceivers, receivers, antennas, etc. Components associated with an IC may include those that are mounted on IC or those connected to an IC. The IC may be either analog or digital and may be used in a number of applications, such as microprocessors, optoelectronics, logic blocks, audio amplifiers, etc., depending on the components associated with the IC. The IC may be employed as part of a chipset for executing one or more related functions in a computer.

Example Backend Memory

FIG. 1 provides an electric circuit diagram of an 1T-1C memory cell 100, according to some embodiments of the present disclosure. As shown, the 1T-1C cell 100 may include an access transistor 110 and a capacitor 120. The access transistor 110 has a gate terminal, a source terminal, and a drain terminal, indicated in the example of FIG. 1 as terminals G, S, and D, respectively. In the following, the terms "terminal" and "electrode/contact" may be used interchangeably. Furthermore, for S/D terminals, the terms "terminal" and "region" may be used interchangeably.

As shown in FIG. 1, in the 1T-1C cell 100, the gate terminal of the access transistor 110 may be coupled to a WL 150, one of the S/D terminals of the access transistor 110 may be coupled to a BL 140, and the other one of the S/D terminals of the access transistor 110 may be coupled to a first electrode of the capacitor 120. As also shown in FIG. 1, the other electrode of the capacitor 120 may be coupled to a capacitor plate-line (PL) 160 (also sometimes referred to as a "select-line" (SL)). As is known in the art, WL, BL, and PL may be used together to read and program the capacitor 120.

Each of the BL 140, the WL 150, and the PL 160, as well as intermediate elements coupling these lines to various terminals described herein, may be formed of any suitable electrically conductive material, which may include an alloy or a stack of multiple electrically conductive materials. In some embodiments, such electrically conductive materials may include one or more metals or metal alloys, with metals such as ruthenium, palladium, platinum, cobalt, nickel, hafnium, zirconium, titanium, tantalum, and aluminum. In some embodiments, such electrically conductive materials may include one or more electrically conductive alloys oxides or carbides of one or more metals.

In some embodiments, the access transistor 110 may be a TFT. In other embodiments, the access transistor 110 may be not a TFT, e.g., a transistor formed on a crystalline semiconductor material provided in the backend of an IC device using layer transfer. For example, in some such embodiments, the access transistor 110 may be a FinFET, a nanowire, or a nanoribbon transistor.

Figure 2A:
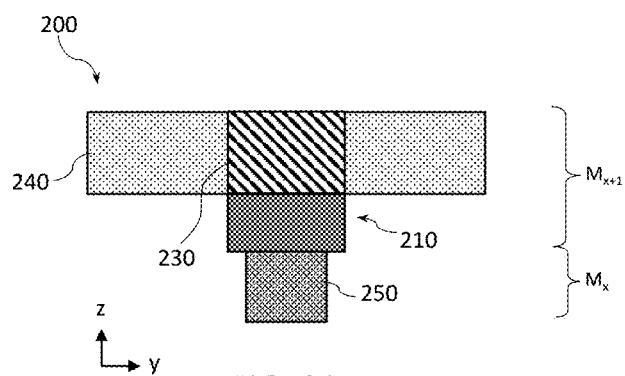
FIGS. 2A-2B are cross-sectional and plan views, respectively, of an example thin-film transistor (TFT) based memory cell with an access TFT, according to some embodiments of the present disclosure.
Figure 2B:
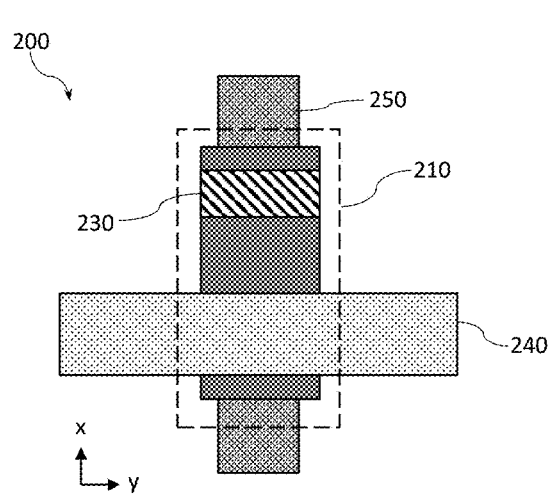
Figure 3A:
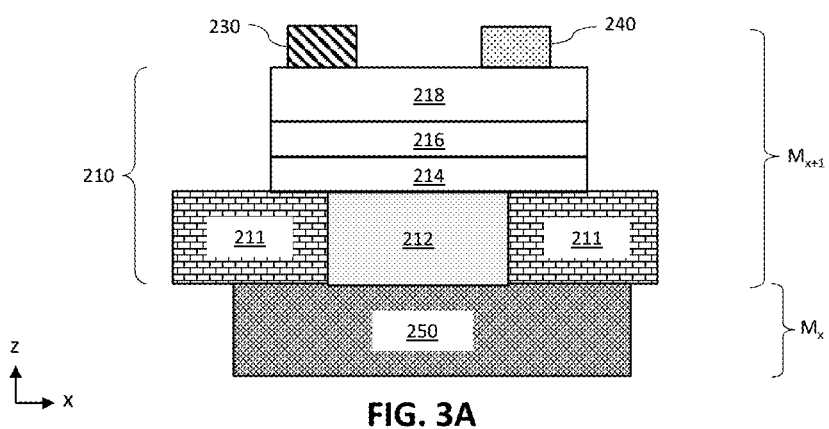
FIGS. 3A-3B are cross-sectional views of an example structure of the access TFT in the memory cell of FIGS. 2A-2B, according to some embodiments of the present disclosure.
Figure 3B:
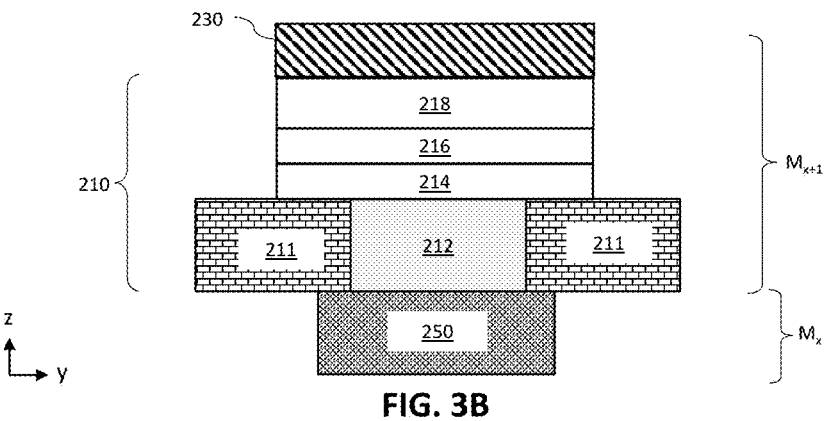

FIGS. 2A-2B are cross-sectional (y-z plane) and plan (y-x plane) views, respectively, of an example access TFT 210 of a given TFT-based memory cell 200, according to some embodiments of the present disclosure. For example, the access TFT 210 may be the access transistor 110 of FIG. 1, and the memory cell 200 may be the memory cell 100 of FIG. 1. FIGS. 3A-3B are cross-sectional views (x-z and y-z planes) of an example structure of the access TFT 210 in the TFT-based memory cell 200 of FIGS. 2A-2B, according to some embodiments of the present disclosure. The memory cell 200 shown in FIGS. 2 and 3 is an example of a memory cell that may be implemented to realize one or more of the memory cells of the backend memory of IC devices with back-side power delivery as described herein, e.g., of IC devices 400 or 500 as described herein. In some embodiments of the IC devices 400 or 500 as described herein, multiple memory cells 200 may be arranged in a stacked architecture, i.e., when different memory cells such as the one shown in FIGS. 2 and 3 are stacked in different interconnect layers of the BEOL layer.

As shown in FIG. 2, the TFT-based memory cell 200 may include a WL 250 (which may be an example of the WL 150 of FIG. 1) to supply a gate signal. As also shown in FIG. 2, the TFT-based memory cell 200 may further include an access TFT 210 that includes a channel layer and is configured to control transfer of a memory state of the memory cell between a first region and a second region of the channel layer in response to the gate signal (channel layer and first and second regions described in greater detail below, e.g., with reference to FIG. 3). In some embodiments, the access TFT 210 may be provided above the WL 250 coupled to the memory cell 200. As also shown in FIG. 2, the memory cell 200 may further include a BL 240 to transfer the memory state and coupled to the first region of the channel layer of the access TFT 210, and a storage node 230 coupled to the second region of the channel layer of the access TFT 210. Although not specifically shown in FIG. 2, the memory cell 200 further includes a capacitor such as the capacitor 120 of FIG. 1, e.g., a metal-insulator-metal (MIM) capacitor coupled to the storage node 230 and configured to store the memory state of the memory cell 200.

Turning to the details of FIG. 2, the access TFT 210 in the memory cell 200 may be coupled to or controlled by WL 250, which, in some embodiments, may serve as the gate of the access TFT 210. A BL 240 (which may be an example of the BL 140 of FIG. 1) may be coupled to one of the S/D regions (or to one of the S/D contacts or terminals) of the access TFT 210 and a storage node 230 may be coupled to the other one of the S/D regions of the access TFT 210. In some embodiments, the BL 240 may serve as a first S/D contact (i.e., an electrically conductive structure for making a contact to a first S/D region of a transistor) and the storage node 230 may serve as the second S/D contact (i.e., an electrically conductive structure for making a contact to a second S/D region of a transistor) of the access TFT 210. The BL 240 may be connected to a sense amplifier and a BL driver which may, e.g., be provided in a memory peripheral circuit associated with a memory array that includes the memory cell 200. In some embodiments, for a given memory cell 200, the WL 250 may be formed in a metal layer Mx (where x is an integer indicating a specific layer) of the BEOL of an IC device, while the access TFT 210, the storage node 230, and the BL 240 may be formed in a metal layer Mx+1 of the BEOL of an IC device, i.e., the metal layer above the metal layer Mx, e.g., directly above the metal layer Mx (as illustrated in FIGS. 2 and 3). A capacitor of the memory cell 200 may then be formed in a metal layer Mx+2 of the BEOL of an IC device, e.g., directly above the metal layer Mx+1.

FIGS. 3A-3B illustrate further details of the access TFT 210. As shown in FIGS. 3A-3B, in some embodiments, the access TFT 210 may be provided substantially above the WL 250. In some embodiments, the access TFT 210 may be a bottom-gated TFT in that its gate stack comprising a gate dielectric 216 and a gate electrode 214 may be provided below its channel layer (also referred to as "active layer") 218, e.g., between the channel layer 218 and the WL 250, and the channel layer 218 may be between the gate stack and the BL 240 forming one of the S/D terminals, e.g., the drain terminal, of the access TFT 210 and the storage node 230 forming another one of the S/D terminals, e.g., the source terminal, of the access TFT 210 (again, in other embodiments, this example designation of S/D terminals may be reversed). Thus, the WL 250 may be between a back-side structure 410 as shown in FIG. 4 and the gate electrode 214, and the BL 240 may be further away from the back-side structure 410 than the channel layer 218.

The channel layer 218 may be composed of semiconductor material systems including, for example, N-type or P-type materials systems. In some embodiments, the channel layer 218 may include a high mobility oxide semiconductor material, such as tin oxide, antimony oxide, indium oxide, indium tin oxide, titanium oxide, zinc oxide, indium zinc oxide, indium gallium zinc oxide (IGZO), gallium oxide, titanium oxynitride, ruthenium oxide, or tungsten oxide. In general, the channel layer 218 may include one or more of tin oxide, cobalt oxide, copper oxide, antimony oxide, ruthenium oxide, tungsten oxide, zinc oxide, gallium oxide, titanium oxide, indium oxide, titanium oxynitride, indium tin oxide, indium zinc oxide, nickel oxide, niobium oxide, copper peroxide, IGZO, indium telluride, molybdenite, molybdenum diselenide, tungsten diselenide, tungsten disulfide, N- or P-type amorphous or polycrystalline silicon, germanium, indium gallium arsenide, silicon germanium, gallium nitride, aluminum gallium nitride, indium phosphite, and black phosphorus, each of which may possibly be doped with one or more of gallium, indium, aluminum, fluorine, boron, phosphorus, arsenic, nitrogen, tantalum, tungsten, and magnesium, etc. In particular, the channel layer 218 may be formed of a thin-film material. Some such materials may be deposited at relatively low temperatures, which allows depositing them within the thermal budgets imposed on back end fabrication to avoid damaging the front end components such as the logic devices of the FEOL layer of an IC device 400 or 500. In some embodiments, the channel layer 218 may have a thickness between about 5 and 75 nanometers, including all values and ranges therein.

The S/D electrodes of the access TFT 210, shown in various figures as provided by the corresponding BL 240 and the storage node 230, respectively, may include any suitable electrically conductive material, alloy, or a stack of multiple electrically conductive materials. In some embodiments, the S/D electrodes of the access TFT 210 may include one or more metals or metal alloys, with metals e.g., copper, ruthenium, palladium, platinum, cobalt, nickel, hafnium, zirconium, titanium, tantalum, and aluminum, tantalum nitride, tungsten, doped silicon, doped germanium, or alloys and mixtures of these. In some embodiments, the S/D electrodes of the access TFT 210 may include one or more electrically conductive alloys, oxides, or carbides of one or more metals. In some embodiments, the S/D electrodes of the access TFT 210 may include a doped semiconductor, such as silicon or another semiconductor doped with an N-type dopant or a P-type dopant. Metals may provide higher conductivity, while doped semiconductors may be easier to pattern during fabrication. In some embodiments, the S/D electrodes of the access TFT 210 may have a thickness (i.e., dimension measured along the z-axis of the example coordinate system shown in the present drawings) between about 2 nanometers and 1000 nanometers, preferably between about 2 nanometers and 100 nanometers.

A gate dielectric 216 may laterally surround the channel layer 218, and the gate electrode 214 may laterally surround the gate dielectric 216 such that the gate dielectric 216 is disposed between the gate electrode 214 and the channel layer 218. In various embodiments, the gate dielectric 216 may include one or more high-k dielectric materials and may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric 216 may include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, tantalum oxide, tantalum silicon oxide, lead scandium tantalum oxide, and lead zinc niobate. In some embodiments, an annealing process may be carried out on the gate dielectric 216 during manufacture of the access TFT 210 to improve the quality of the gate dielectric 216. In some embodiments, the gate dielectric 216 may have a thickness between about 0.5 nanometers and 3 nanometers, including all values and ranges therein, e.g., between about 1 and 3 nanometers, or between about 1 and 2 nanometers.

In some embodiments, the gate dielectric 216 may be a multilayer gate dielectric, e.g., it may include any of the high-k dielectric materials in one layer and a layer of IGZO.

In some embodiments, the gate stack (i.e., a combination of the gate dielectric 216 and the gate electrode 214) may be arranged so that the IGZO is disposed between the high-k dielectric and the channel layer 218. In such embodiments, the IGZO may be in contact with the channel layer 218, and may provide the interface between the channel layer 218 and the remainder of the multilayer gate dielectric 216. The IGZO may have a gallium to indium ratio of 1:1, a gallium to indium ratio greater than 1 (e.g., 2:1, 3:1, 4:1, 5:1, 6:1, 7:1, 8:1, 9:1, or 10:1), and/or a gallium to indium ratio less than 1 (e.g., 1:2, 1:3, 1:4, 1:5, 1:6, 1:7, 1:8, 1:9, or 1:10).

The gate electrode 214 may include at least one P-type work function metal or N-type work function metal, depending on whether the access TFT 210 is a P-type metal oxide semiconductor (PMOS) transistor or an N-type metal oxide semiconductor (NMOS) transistor. For a PMOS transistor, metals that may be used for the gate electrode 214 may include, but are not limited to, ruthenium, palladium, platinum, cobalt, nickel, and conductive metal oxides (e.g., ruthenium oxide). For an NMOS transistor, metals that may be used for the gate electrode 214 include, but are not limited to, hafnium, zirconium, titanium, tantalum, aluminum, alloys of these metals, and carbides of these metals (e.g., hafnium carbide, zirconium carbide, titanium carbide, tantalum carbide, and aluminum carbide). In some embodiments, the gate electrode 214 may include a stack of two or more metal layers, where one or more metal layers are work function metal layers and at least one metal layer is a fill metal layer. Further metal layers may be included for other purposes, such as to act as a diffusion barrier layer, described below.

FIGS. 3A-3B further illustrate that the bottom-gated access TFT 210 may further, optionally, include layers such as a diffusion barrier layer 212, which may be surrounded by a layer of etch-resistant material (e.g., an etch-stop layer 211). In some embodiments, the diffusion barrier 212 may be a metal- or copper-diffusion barrier (e.g., a conductive material to reduce or prevent the diffusion of metal or copper from WL 250 into the gate electrode 214 while still maintaining an electrical connection between the WL 250 and the gate electrode 214) on the WL 250 such as TaN, tantalum (Ta), titanium zirconium nitride (e.g., TiXZr1-XN, such as X=0.53), titanium nitride (e.g., TiN), titanium tungsten (TiW), combination (such as a stack structure of TaN on Ta), or the like. For instance, the diffusion barrier 212 can include a single- or multilayer structure including a compound of tantalum (Ta) and nitrogen (n), such as TaN or a layer of TaN on a layer of Ta. In some embodiments, a layer of an etch-resistant material (e.g., the etch-stop 211) such as silicon nitride or silicon carbide may be formed over the WL 250 with vias for a metal (or copper) diffusion barrier film 212 such as TaN or a TaN/Ta stack. The gate electrode 214 can be a conductive material on the diffusion barrier 212, such as metal, conductive metal oxide or nitride, or the like. For example, in one embodiment, the gate electrode 214 may be titanium nitride (TiN). In another embodiment, the gate electrode 214 may be tungsten (W).

The channel layer 218 can be in contact with the BL 240 (e.g., at a first S/D region of the channel layer 218, e.g., a drain region) and with the storage node 230 (e.g., at a second S/D region of the channel layer 218, e.g., a source region, with a semiconducting channel region of the access TFT 210 being between the first S/D region and the second S/D region). In some embodiments, such a channel region may include only majority carriers in the thin film. Accordingly, the channel layer 218 may require a relatively high bias (as e.g., supplied by the WL 250, diffusion barrier film 212, and gate electrode 214) to activate.

Example IC Devices with Back-Side Power Delivery to Backend Memory

Figures 4A, 4B, 4C:
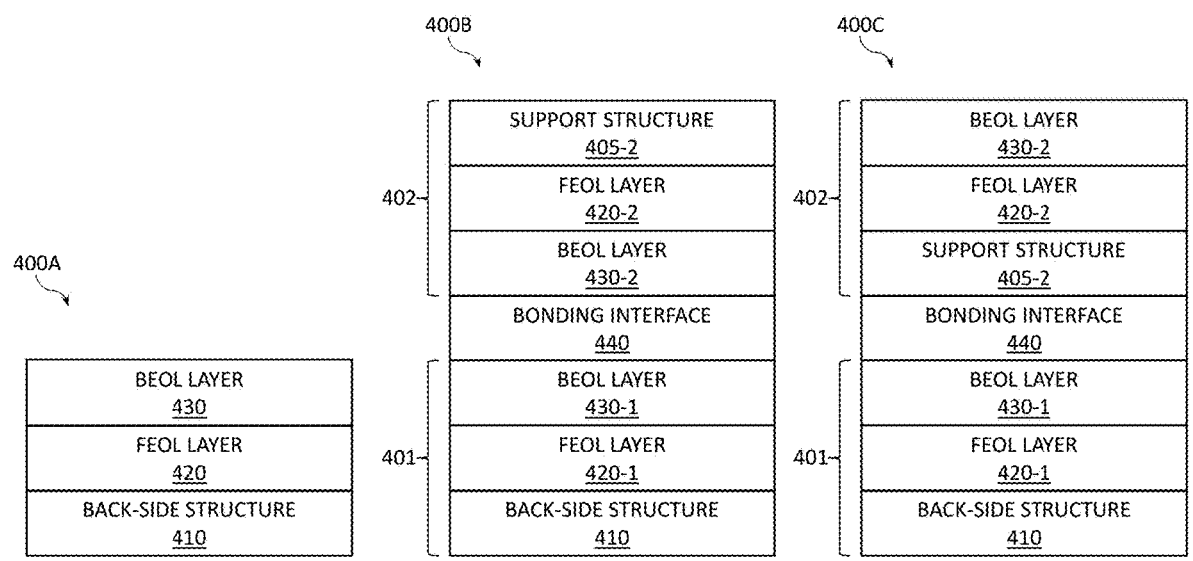
FIGS. 4A-4C provide schematic illustrations of integrated circuit (IC) devices with back-side reveal for power delivery to backend memory, according to various embodiments of the present disclosure.

FIGS. 4A-4C provide schematic illustrations of IC devices 400 (labeled in individual ones of FIGS. 4A-4C as IC devices 400A, 400B, and 400C) with back-side reveal for power delivery to backend memory, according to various embodiments of the present disclosure.

As shown in FIG. 4A, the IC device 400A may include an FEOL layer 420 and a BEOL layer 430 above the FEOL layer 420. As also shown in FIG. 4A, the IC device 400A may further include a back-side structure 410 (e.g., a back-side power delivery structure), so that the FEOL layer 420 is between the back-side structure 410 and the BEOL layer 430.

The FEOL layer 420 may include a plurality of FEOL devices, e.g., frontend transistors such as FinFETs, nanowire transistors, nanoribbon transistors, etc. In some embodiments, some or all of the frontend transistors may be implemented as transistors with back-side contacts. In some embodiments, some or all of the frontend transistors may be implemented as transistors with front-side contacts. In general, a transistor is described as a transistor with front-side contacts if both S/D contacts of the transistor are on one side of a channel material of the transistor, above the channel material of the transistor. On the other hand, a transistor is described as a transistor with back-side contacts if either both S/D contacts of the transistor are below the channel material of the transistor or if one S/D contact is on one side with respect to the channel material (e.g., above the channel material) and the other S/D contact is on the opposite side (e.g., below the channel material).

The BEOL layer 430 may include at least one layer of backend memory, e.g., a memory array with a plurality of 1T-1C memory cells as described herein, e.g., memory cells 100/200 as described herein, or a stack of such layers/arrays. In addition, the BEOL layer 430 may further include a plurality of backend interconnects electrically coupled to (e.g., in electrically conductive contact with at least portions of) one or more of the plurality of FEOL devices of the FEOL layer 420 and/or one or more of the plurality of memory cells of the backend memory.

In some embodiments, the frontend transistors implemented in the FEOL layer 420 may be a part of compute logic, e.g., to serve as a memory peripheral circuit for the memory arrays implemented in the BEOL layer 430. For example, the frontend transistors may be responsible for compute logic functionality related to read/write operations with respect to the data stored in the memory cells that may be implemented in the BEOL layer 430. To that end, some of the frontend transistors of the FEOL layer 420 may be part of one or more input/output (I/O) ICs (e.g., a memory peripheral circuit) configured to control (e.g., control access (read/write), store, refresh) the memory cells implemented in the IC device 400 (e.g., memory cells implemented in the BEOL layer 430). In some embodiments, some of the frontend transistors of the FEOL layer 420 may be part of high-performance compute logic, configured to perform various operations with respect to data stored in the memory cells implemented in the IC device 400 (e.g., arithmetic and logic operations, pipelining of data from one or more of the memory arrays implemented in the IC device 400, and possibly also data from external devices/chips). In some embodiments of the IC device 400, the compute logic may be provided in the FEOL 420 and in one or more lowest metal layer of the BEOL layer 430, while one or more backend memory arrays may be provided in higher layers of the BEOL layer 430. In other embodiments of the IC device 400, the compute logic described with reference to the FEOL layer 420 may be provided above the FEOL layer 420 (e.g., in the BEOL layer 430), in between memory layers of the BEOL layer 430, or combined with the memory layers of the BEOL layer 430.

Various interconnect layers of the BEOL layer 430 may be/include metal layers of a metallization stack of the IC device 400. Various metal layers of the BEOL layer 430 may be used to interconnect the various inputs and outputs of the logic devices in the compute logic of the FEOL layer 420 and/or of the memory cells in the memory layers of the BEOL layer 430. Generally speaking, each of the metal layers of the BEOL layer 430 may include a via portion and a trench/interconnect portion. The trench portion of a metal layer is configured for transferring signals and power along electrically conductive (e.g., metal) lines (also sometimes referred to as "trenches") extending in the x-y plane (e.g., in the x or y directions), while the via portion of a metal layer is configured for transferring signals and power through electrically conductive vias extending in the z-direction, e.g., to any of the adjacent metal layers above or below. Accordingly, vias connect metal structures (e.g., metal lines or vias) from one metal layer to metal structures of an adjacent metal layer. While referred to as "metal" layers, various layers of the BEOL layer 430 may include only certain patterns of conductive metals, e.g., copper (Cu), aluminum (Al), tungsten (W), or cobalt (Co), or metal alloys, or more generally, patterns of an electrically conductive material, formed in an insulating medium such as an ILD. The insulating medium may include any suitable ILD materials such as silicon oxide, carbon-doped silicon oxide, silicon carbide, silicon nitride, aluminum oxide, and/or silicon oxynitride.

The FEOL layer 420 may originally be provided over a semiconductor support structure such as a substrate, a die, a wafer or a chip. Such a semiconductor support structure may, e.g., be the support structure 502, or the wafer 2000 of FIG. 9A, discussed below.

While the FEOL layer 420 may originally be provided over a semiconductor support structure as described above, such a semiconductor support structure may subsequently be removed to expose the back-side portions of the FEOL devices of the FEOL layer 420 so that a back-side structure 410 may be provided at the back side of the FEOL layer 420 (thus, the BEOL layer 430 are provided at the front side of the FEOL layer 420 and the back-side structure 410 is provided at the back side of the FEOL layer 420). The back-side structure 410 may include a plurality of interconnects (i.e., metal lines and vias) configured to provide power to one or more devices (e.g., logic transistors) of the FEOL layer 420 and to one or more devices (e.g., backend memory cells) of the BEOL layer 430. In some embodiments, the back-side structure 410 may further include various IC components (e.g., capacitors, inductors, resistors, etc.) for reducing the parasitic effects of the IC device 400A, e.g., for reducing parasitic effects associated with the interconnects used for power delivery.

Providing power from the back side of an IC device as shown in FIG. 4A may be advantageous in terms of easier fabrication and decreased complexity of power routing to backend memory implemented in the BEOL layer 430. In addition, when an IC device is a combination of multiple IC structures bonded together, especially where some of the IC structures have their front sides bonded to other IC structures, providing power from the back side of such IC structures may be the only option possible. For example, in some embodiments, an IC device may include a first IC structure bonded with a second IC structure in a front-to-front (f2f) arrangement. An example of such an IC device is shown, as an IC device 400B, in FIG. 4B. The IC device 400B may include a first IC structure 401 that includes an FEOL layer 420-1 and a BEOL layer 430-1, a second IC structure 402 that includes an FEOL layer 420-2 and a BEOL layer 430-2, and a bonding interface 440 between the first and second IC structures 401, 402. In particular, the first and second IC structures of the IC device 400B are bonded in a f2f arrangement because the bonding interface 440 is between the front side of the first IC structure 401 (i.e., the face above the BEOL layer 430-1) and the front side of the second IC structure 402 (i.e., the face above the BEOL layer 430-2), as is shown in FIG. 4B. Because the front sides of the IC structures 401, 402 are used for bonding, the back-side structure 410 may advantageously be used at the back side of one of these IC structures, e.g., at the back side of the first IC structure 401, as shown in FIG. 4B, to provide power to various components of the first and second IC structures. In another example, in some embodiments, an IC device may include a first IC structure bonded with a second IC structure in a front-to-back (f2b) arrangement. An example of such an IC device is shown, as an IC device 400C, in FIG. 4C. Similar to the IC device 400B, the IC device 400C may include a first IC structure 401 that includes an FEOL layer 420-1 and a BEOL layer 430-1, a second IC structure 402 that includes an FEOL layer 420-2 and a BEOL layer 430-2, and a bonding interface 440 between the first and second IC structures 401, 402. In contrast to the IC device 400B, in the IC device 400C, the first and second IC structures 401, 402 are bonded in a f2b arrangement because the bonding interface 440 is between the front side of the first IC structure 401 (i.e., the face above the BEOL layer 430-1) and the back side of the second IC structure 402, e.g., with a support structure 405-2 of the second IC structure 402, as is shown in FIG. 4C. Because the front side of the first IC structure 401 is used for bonding, the back-side structure 410 may advantageously be used at the back side of the first IC structure 401, as shown in FIG. 4C, to provide power to various components of the first and second IC structures 401, 402.

For both the IC device 400B and the IC device 400C, the FEOL layers 420-1 and 420-2 are examples of the FEOL layer 420 as described with reference to FIG. 4A, while the BEOL layers 430-1 and 430-2 are examples of the BEOL layer 430 as described with reference to FIG. 4A. Furthermore, in some embodiments of the IC devices 400B and 400C, the support structure 405-2 of the second IC structure 402 may be absent, e.g., by being removed (e.g., using a suitable thinning/polishing process) after the second IC structure 402 has been bonded to the first IC structure 401 for the f2f embodiment of FIG. 4B, or by being removed before the second IC structure 402 is bonded to the first IC structure 401 for the f2b embodiment of FIG. 4C. Still further, in some embodiments of the IC devices 400B and 400C, similarly, the FEOL layer 420-2 may be absent.

FIGS. 5A-5D provide cross-sectional views of example IC devices 500 with a single IC structure with back-side reveal for power delivery to backend memory, according to various embodiments of the present disclosure. A number of elements labeled in FIG. 5 and in at least some of the subsequent figures are illustrated in these figures with different patterns, with a legend showing the correspondence between the reference numerals and patterns being provided at the bottom of each drawing page containing these figures. For example, the legend illustrates that FIG. 5 uses different patterns to show frontend transistors 504, an ILD material 506, interconnects 508, etc. Furthermore, although a certain number of a given element may be illustrated in FIG. 5 and in at least some of the subsequent figures (e.g., FIGS. 6-8), this is also simply for ease of illustration, and more, or less, than that number may be included in an IC device according to various embodiments of the present disclosure. Still further, FIG. 5 and at least some of the subsequent figures (e.g., FIGS. 6-8) are intended to show relative arrangements of various elements in example IC devices with back-side reveal for power delivery to backend memory, and that various IC devices with back-side reveal for power delivery to backend memory, or portions thereof, may include other elements or components that are not illustrated (e.g., any further materials, such as spacer materials that may surround the gate stack of the transistors, etch-stop materials, etc.).

The IC device 500A may be an example implementation of the IC device 400A, which is indicated in FIG. 5A by labeling the back-side structure 410, the FEOL layer 420, and the BEOL layer 430 on the left side of FIG. 5A. As shown in FIG. 5A, in some embodiments, the FEOL layer 420 may include frontend device 504, e.g., frontend transistors 504. The details of the frontend transistors 504 are not shown in FIG. 5A because various architectures of such transistors are known and the frontend transistors 504 may include a transistor of any architecture as known in the art. The channel regions of the frontend transistors 504 may include a semiconductor material that may originally be a portion of the support structure of the IC device 500A, which is later removed and replaced by the back-side structure 410.

FIG. 5A illustrates an ILD material 506 and a plurality of interconnects 508 above the frontend transistors 504. In various embodiments, the ILD material 506 may include any suitable ILD materials such as silicon oxide, carbon-doped silicon oxide, silicon carbide, silicon nitride, aluminum oxide, and/or silicon oxynitride. In various embodiments, the ILD material 506 may include any of the low-k dielectric materials described above. In various embodiments, the interconnects 508 may include any of the electrically conductive materials described above.

A portion of the ILD material 506 directly above and surrounding portions of the frontend transistors 504, and one or more of the interconnects 508 in that portion of the ILD material 506 may be seen as a part of the FEOL layer 420, whereas everything above may be seen as a part of the BEOL layer 430, as labeled in FIG. 5A. In particular, the BEOL layer 430 may include a metallization stack of a plurality of metal layers labeled in FIG. 5A as a metal layer 1 (M1), a metal layer 2 (M2), and so on. Although not specifically shown in FIG. 5A, a layer of an etch-stop (ES) material may be present between at least portions of adjacent metal layers of the BEOL layer 430, as known in the art.

In some embodiments, even when only a single layer of backend memory cells is implemented, the backend memory may occupy a plurality of consecutive metal layers of the metallization stack of an IC device. This is shown in FIG. 5A with the backend memory being in the metal layers M5, M6, and M7. In particular, FIG. 5A illustrates access transistors 510, S/D contacts 512 for the access transistors 510, and capacitors 514. FIG. 5A further provides a label for a memory cell 520, illustrated in FIG. 5A within a dashed rectangular contour, that includes one access transistor 510 and one capacitor 514, coupled to one of the S/D contacts 512 of the access transistor 510. Thus, the memory cell 520 is an example of a 1T-1C memory cell, e.g., the memory cell 100 as described above, where the access transistor 510 is an example of the access transistor 110, and the capacitor 514 is an example of the capacitor 120, described above. In particular, the access transistor 510 is a backend transistor and the memory cell 520 is a backend memory cell. Two such memory cells 520 are shown in FIG. 5A, but only one is labeled with reference numerals in order to not clutter the drawing. The memory cell 520 may be a backend memory cell according to any of the embodiments described above, e.g., an eDRAM memory cell as explained with reference to FIGS. 1-3. For example, as shown in FIG. 5A, in some embodiments of the memory cell 520, one of the interconnects 508 in a metal layer M5 may form a WL such as the WL 250, described above, while the access transistor 510, a storage node such as the storage node 230, and a BL such as the BL 240 may be formed in a metal layer M6 of the BEOL 430 (i.e., the metal layer directly above the metal layer M5), and the capacitor 514 may then be formed in a metal layer M7 (i.e., the metal layer directly above the metal layer M6). FIG. 5A further illustrates a PL such as the PL 160, described above, which may be coupled to one of the interconnects 508 in the metal layer M7. In other embodiments of the IC device 500A, backend memory with memory cells as the memory cell 520 may be implemented in other metal layers of the BEOL layer 430, any number of memory cells 520 may be included in a given layer/array of backend memory cells, and multiple layers of backend memory cells such as the memory cell 520 may be stacked over one another, thus implementing three-dimensional (3D) stacked backend memory.

Together, the FEOL layer 420 and the BEOL layer 430 of the IC device 500A may be seen as a part of an IC structure 401 in which a support structure on which the frontend transistors 504 were built has been removed and replaced by the back-side structure 410. To that end, a back side 534-1 and a front side 534-2 of the IC structure 401 may be defined as shown in FIG. 5A, illustrating that the back side 534-1 is the side where the support structure was removed and the back-side structure 410 was provided, and illustrating that the front side 534-2 is the face of the IC structure 401 that is opposite the back side 534-2, e.g., the surface of the BEOL layer 430.

Turning to the details of the back-side structure 410 of the IC device 500A, FIG. 5A illustrates that the back-side structure 410 may include a back-side insulator 516 and a plurality of back-side interconnects 518 that may be coupled to any of the memory cells 520 of the backend memory implemented in the BEOL 430 in order to provide power to the backend memory. In some embodiments, the back-side interconnects 518 may also be coupled to the frontend transistors 504, to provide power to those components as well. The back-side interconnects 518 may include any suitable back-side interconnect structures, such as trench structures and/or via structures, e.g., as described below with reference to the interconnect structures 2128, shown in FIG. 10. In some embodiments, the back-side interconnects 518 may be arranged within back-side interconnect layers 536-538 to route electrical signals to/from the backend memory in the BEOL layer 430 according to a wide variety of designs (in particular, the arrangement is not limited to the particular configuration of the back-side interconnects 518 depicted in FIG. 5A or other drawings). Although a particular number of interconnect layers 536-538 in which the back-side interconnects 518 are disposed is depicted in FIG. 5A and in other drawings, embodiments of the present disclosure include IC devices having more or fewer interconnect layers 536-538 with the back-side interconnects 518 than depicted. The interconnect layers 536-538 may be similar to the interconnect layers 2106-2110 shown in FIG. 10, but at the back side of the IC device.

In some embodiments, the back-side interconnects 518 may be coupled to a given memory cell 520 by an electrical feedthrough network 524 of the interconnects 508, as is shown in FIG. 5A (i.e., a back-side interconnect 518 may be coupled to a memory cell 520 via a plurality of the interconnects 508 within a dotted contour labeled in FIG. 5A with the reference numeral "524"). In other embodiments, the back-side interconnects 518 may be coupled to a given memory cell 520 by a via 530, as is shown with an IC device 500B of FIG. 5B, where the via 530 may extend from a front side 534-2 of the IC device 500B towards and reaching the back side 534-1 and further extending into the back-side insulator 516 to make an electrical contact with at least one back-side interconnect 518, and where the via 530 may be coupled to the memory cell 520. Besides the manner of coupling at least one back-side interconnect 518 to at least one memory cell 520 of the backend memory by using a via 530, the IC device 500B may be substantially the same as the IC device 500A, described above. In order to not clutter the drawing, some of the elements of the IC device 500A that are also shown in the IC device 500B are not labeled for the IC device 500B with the reference numerals, e.g., various elements of the memory cell 520, or various metal layers M1, M2, etc., of the BEOL layer 430. This also applies to subsequent drawings of FIG. 5. In various embodiments of the IC devices 500 as shown in FIG. 5, any of the memory cells 520 may be coupled by any of the back-side interconnects 518 using any manner of coupling, such as the electrical feedthrough network 524 as shown in FIG. 5A or the via 530 as shown in FIG. 5B, or by any combination of the electrical feedthrough networks 524 and the vias 530.

In various embodiments, the interconnects 508, the back-side interconnects 518, and the via 530 may be implemented as known in the art. For example, in some embodiments, any of the interconnects 508, the back-side interconnects 518, and the via 530 may include an electrically conductive fill material and, optionally, a liner. The electrically conductive fill material may include one or more of copper, tungsten, aluminum, ruthenium, cobalt, etc. (e.g., in proportions of between 1:1 to 1:100), or any of the electrically conductive materials described above. The liner may be an adhesion liner and/or a barrier liner. For example, the liner may be a liner having one or more of tantalum, tantalum nitride, titanium nitride, tungsten carbide, cobalt, etc. In the liner and/or in the electrically conductive fill material of any of the interconnects 508, the back-side interconnects 518, and the via 530, any of the individual materials (e.g., any of the examples listed above) may be included in the amount of between about 1% and 75%, e.g., between about 5% and 50%, indicating that these materials are included by intentional alloying of materials, in contrast to potential accidental doping or impurities being included, which would be less than about 0.1% for any of these metals. In general, material compositions of liners and/or electrically conductive fill materials of any of the interconnects 508, the back-side interconnects 518, and the via 530 may, but do not have to be, the same. The back-side insulator 516 may include any of the materials described with reference to the ILD 506, where, in general, material compositions of the back-side insulator 516 and the ILD 506 may, but do not have to be, the same.

IC devices with back-side reveal for power delivery to backend memory, as described herein, may be fabricated using any suitable techniques, e.g., subtractive, additive, damascene, dual-damascene, etc. Some of such technique may include suitable deposition and patterning techniques. As used herein, "patterning" may refer to forming a pattern in one or more materials using any suitable techniques (e.g., applying a resist, patterning the resist using lithography, and then etching the one or more material using dry etching, wet etching, or any appropriate technique).

FIGS. 6A-6F provide cross-sectional side views at different stages of fabricating an IC device with a single IC structure with back-side reveal for power delivery to back-end memory (e.g., the IC device 500A or the IC device 500B), according to some embodiments of the present disclosure. The example fabrication method shown in FIGS. 6A-6F may include other operations not specifically shown in FIGS. 6A-6F, such as various cleaning or planarization operations as known in the art. For example, in some embodiments, any of the layers of the IC device may be cleaned prior to, after, or during any of the processes of the fabrication method described herein, e.g., to remove oxides, surface-bound organic and metallic contaminants, as well as subsurface contamination. In some embodiments, cleaning may be carried out using e.g., a chemical solutions (such as peroxide), and/or with ultraviolet (UV) radiation combined with ozone, and/or oxidizing the surface (e.g., using thermal oxidation) then removing the oxide (e.g., using hydrofluoric acid (HF)). In another example, the top surfaces of the IC devices described herein may be planarized prior to, after, or during any of the processes of the fabrication method described herein, e.g., to remove overburden or excess materials. In some embodiments, planarization may be carried out using either wet or dry planarization processes, e.g., planarization be a chemical mechanical planarization (CMP), which may be understood as a process that utilizes a polishing surface, an abrasive and a slurry to remove the overburden and planarize the surface.

The fabrication method may begin with a process 602, shown in FIG. 6A, that includes providing a support structure 502, forming the FEOL layer 420 on the support structure 502, and then forming the BEOL layer 430 with backend memory over the FEOL layer 420. The FEOL layer 420 and the BEOL layer 430 provided in the process 602 may be as those described above. The support structure 502 may include any suitable material or structure upon which the FEOL layer 420 may be provided. As shown in FIG. 6A, as a result of performing the process 602, the back side 534-1 is the back side of the support structure 502, and the front side 534-2 is the top surface of the BEOL layer 430.

In some embodiments, the support structure 502 may be a semiconductor support structure, e.g., a semiconductor substrate, composed of semiconductor material systems including, for example, N-type or P-type materials systems. In one implementation, the semiconductor substrate may be a crystalline substrate formed using a bulk silicon or a silicon-on-insulator (SOI) substructure. In other implementations, the semiconductor substrate may be formed using alternate materials, which may or may not be combined with silicon, that include, but are not limited to, germanium, silicon germanium, indium antimonide, lead telluride, indium arsenide, indium phosphide, gallium arsenide, aluminum gallium arsenide, aluminum arsenide, indium aluminum arsenide, aluminum indium antimonide, indium gallium arsenide, gallium nitride, indium gallium nitride, aluminum indium nitride or gallium antimonide, or other combinations of group III-V materials (i.e., materials from groups III and V of the periodic system of elements), group II-VI (i.e., materials from groups II and IV of the periodic system of elements), or group IV materials (i.e., materials from group IV of the periodic system of elements). In some embodiments, the substrate may be non-crystalline. In some embodiments, the substrate may be a printed circuit board (PCB) substrate. Although a few examples of materials from which the substrate may be formed are described here, any material that may serve as a foundation upon which the FEOL layer 420 as described herein may be built falls within the spirit and scope of the present disclosure. In various embodiments, channel materials of the frontend transistors 504 of the FEOL layer 420 may include, or may be formed upon, any such substrate material.

In some embodiments, the channel material of the frontend transistors 504 of the FEOL layer 420 may be composed of semiconductor material systems including, for example, N-type or P-type materials systems. In some embodiments, the channel material of the frontend transistors 504 may include a high mobility oxide semiconductor material, such as tin oxide, antimony oxide, indium oxide, indium tin oxide, titanium oxide, zinc oxide, indium zinc oxide, gallium oxide, titanium oxynitride, ruthenium oxide, or tungsten oxide. In some embodiments, the channel material of the frontend transistors 504 may include a combination of semiconductor materials where one semiconductor material may be used for the channel portion and another material, sometimes referred to as a "blocking material," may be used between the channel portion and the support structure over which the frontend transistors are provided. In some embodiments, the channel material of the frontend transistors 504 may include a monocrystalline semiconductor, such as silicon (Si) or germanium (Ge). In some embodiments, the channel material of the frontend transistors 504 may include a compound semiconductor with a first sub-lattice of at least one element from group III of the periodic table (e.g., Al, Ga, In), and a second sub-lattice of at least one element of group V of the periodic table (e.g., P, As, Sb).

For some example N-type transistor embodiments (i.e., for the embodiments where a given frontend transistor 504 is an NMOS), the channel portion of the frontend transistor 504 may advantageously include a III-V material having a high electron mobility, such as, but not limited to InGaAs, InP, InSb, and InAs. For some such embodiments, the channel portion may be a ternary III-V alloy, such as InGaAs, GaAsSb, InAsP, or InPSb. For some $InxGa_{1-x}As$ fin embodiments, In content (x) may be between 0.6 and 0.9, and may advantageously be at least 0.7 (e.g., $In_{0.7}Ga_{0.3}As$). In some embodiments with highest mobility, the channel portion may be an intrinsic III-V material, i.e., a III-V semiconductor material not intentionally doped with any electrically active impurity. In alternate embodiments, a nominal impurity dopant level may be present within the channel portion, for example to further fine-tune a threshold voltage Vt, or to provide HALO pocket implants, etc. Even for impurity-doped embodiments however, impurity dopant level within the channel portion of the frontend transistors 504 may be relatively low, for example below $10^{15}$ dopant atoms per cubic centimeter ($cm^{-3}$), and advantageously below $10^{13}$ $cm^{-3}$.

For some example P-type transistor embodiments (i.e., for the embodiments where a given frontend transistor 504 is a PMOS), the channel portion of the frontend transistor 504 may advantageously be a group IV material having a high hole mobility, such as, but not limited to Ge or a Ge-rich SiGe alloy. For some example embodiments, the channel portion may have a Ge content between 0.6 and 0.9, and advantageously may be at least 0.7. In some embodiments with highest mobility, the channel portion may be intrinsic III-V (or IV for P-type devices) material and not intentionally doped with any electrically active impurity. In alternate embodiments, one or more a nominal impurity dopant level may be present within the channel portion of the frontend transistors 504, for example to further set a threshold voltage (Vt), or to provide HALO pocket implants, etc. Even for impurity-doped embodiments however, impurity dopant level within the channel portion is relatively low, for example below $10^{15}$ cm$^{-3}$, and advantageously below $10^{13}$ cm$^{-3}$.

The fabrication method may then proceed with a process 604, shown in FIG. 6B, that includes turning the IC device fabricated in the process 602 over so that further processing may be performed on the back side 534-1. Thus, FIG. 6B illustrates the same IC device as that shown in FIG. 6A, except that the back side 534-1 is now facing upwards and the front side 534-2 is at the bottom.

Next, the fabrication method may proceed with a process 606, shown in FIG. 6C, that includes removing the support structure 502. In some embodiments, the process 606 may include any suitable grinding or polishing process to reduce the thickness of the support structure 502. In some embodiments, grinding may be performed until the S/D regions of the frontend transistors 504 are exposed, as is shown in the present drawings and, in particular, in FIG. 6C. However, in other embodiments, a portion of the support structure 502 may remain above the frontend transistors 504 (not shown in the present drawings), i.e., the S/D regions of the transistors of the frontend transistors 504 may not necessarily be exposed as long as the back-side interconnects 518 may later be provided so as to electrically couple to the backend memory as described herein. As a result of performing the process 606, the back side 534-1 of the IC structure 401 is moved closer to the front side 534-2, compared to the result of performing the process 604.

The fabrication method may then proceed with a process 608, shown in FIG. 6D, that includes forming the back-side structure 410 on the back side 534-1 of the IC structure 401.

The fabrication method may then proceed with a process 610, shown in FIG. 6E, that includes turning the IC device fabricated in the process 608 over so that, if needed, further processing may be performed on the front side 534-2. Thus, FIG. 6E illustrates the same IC device as that shown in FIG. 6D, except that the front side 534-2 is now facing upwards and the back side 534-1 is at the bottom.

In some embodiments, the fabrication method may end with the process 610, e.g., if the IC device to be fabricated is the IC device 500A as shown in FIG. 5A. In other embodiments, the fabrication method may also include a process 612, shown in FIG. 6F, that includes providing a via 530 as described above, if the IC device to be fabricated is the IC device 500B as shown in FIG. 5B.

Because of different fabrication processes being performed on different sides during the fabrication of the IC devices 500A and 500B, in some embodiments, these devices may exhibit characteristic features indicative of the fabrication method as shown in FIGS. 6A-6F. In particular, for certain manufacturing processes, cross-sectional shapes of various interconnects in the plane such as that shown in FIGS. 5 and 6 may be trapezoidal, i.e., a cross-section of an interconnect may have two parallel sides, one of which is a short side and another one of which is a long side. For example, dual-Damascene or single-Damascene processes for manufacturing interconnects could result in such trapezoidal cross-sections. Therefore, examining the trapezoidal cross-sectional shapes of the interconnects 508, the back-side interconnects 518, and the via 530 may reveal characteristic features of the fabrication method as shown in FIGS. 6A-6F. In particular, for both the IC device 500A and the IC device 500B, the short sides of the trapezoidal cross-sections of the interconnects 508 may be closer to the back-side structure 410 than their long sides, or, phrased differently, the long sides of the trapezoidal cross-sections of the interconnects 508 may be closer to the front side 534-2 than their short sides. Furthermore, for both the IC device 500A and the IC device 500B, the short sides of the trapezoidal cross-sections of the back-side interconnects 518 may be closer to the FEOL layer 420 than their long sides, or, phrased differently, the long sides of the trapezoidal cross-sections of the back-side interconnects 518 may be further away from to the front side 534-2 than their short sides. In addition, for the IC device 500B, the short side of the trapezoidal cross-section of the via 530 may be closer to the back-side structure 410 than its' long sides, or, phrased differently, the long side of the trapezoidal cross-section of the via 530 may be at the front side 534-2, while the short side of the trapezoidal cross-section of the via 530 may be in contact with one or more of the back-side interconnects 518.

FIGS. 5 and 6 illustrate IC devices with a single IC structure 401, as examples corresponding to the IC device of FIG. 4A. FIGS. 7 and 8 illustrate IC devices with multiple IC structures 401, 402, as examples corresponding to the IC devices of FIG. 4B and FIG. 4C.

FIGS. 7A-7D provide cross-sectional views of example IC devices 700 with multiple IC structures bonded together and with back-side reveal for power delivery to backend memory, according to various embodiments of the present disclosure.

The IC device 700A may be an example implementation of the IC device 400B, which is indicated in FIG. 7A by labeling the back-side structure 410, the FEOL layer 420-1, the BEOL layer 430-1, the FEOL layer 420-2, the BEOL layer 430-2, and the bonding interface 400 on the left side of FIG. 7A. The IC structure 401 and the back-side structure 410 of the IC device 700A may be substantially the same as, respectively, the IC structure 401 and the back-side structure 410 of the IC device 500A, described above, except that for the IC device 700A, the FEOL layer 420 and the BEOL layer 430 of the IC structure 401 are labeled as, respectively, the FEOL layer 420-1 and the BEOL layer 430-1. Furthermore, the IC structure 402 of the IC device 700A may be substantially the same as the IC structure 401 of the IC device 500A, described above, except that for the IC device 700A, the FEOL layer 420 and the BEOL layer 430 of the IC structure 402 are labeled as, respectively, the FEOL layer 420-2 and the BEOL layer 430-2.

As can be seen in FIG. 7A, the IC device 700A is an f2f-bonded assembly of the IC structures 401 and 402 because the front side 534-2 of the IC structure 402 is bonded to the front side 534-2 of the IC structure 401. Thus, in an f2f-bonded assembly, one of the IC structures 401, 402 is flipped upside down for bonding so that the top face of the flipped IC structure is facing and is bonded to the top face of the IC structure that is not flipped.

In general, bonding of the IC structures 401, 402 may be performed as follows. First, the IC structures 401 and 402 may be fabricated individually. In some embodiments, they may be fabricated at different manufacturing facilities, by different companies, etc. After that, one face of the IC structure 401 and one face of the IC structure 402 may be bonded. In some embodiments, bonding of the faces of the IC structures 401 and 402 may be performing using insulator-insulator bonding, e.g., as oxide-oxide bonding, where an insulating material of the IC structure 401 is bonded to an insulating material of the IC structure 402. In some embodiments, a bonding material 540, shown in FIGS. 7A-7D, may be present in between at least portions of the faces of the IC structures 401 and 402 that are bonded together. To that end, the bonding material 540 may be applied to at least portions of the one or both faces of the IC structures 401 and 402 that should be bonded and then the IC structures 401 and 402 are put together, possibly while applying a suitable pressure and heating up the assembly to a suitable temperature (e.g., to moderately high temperatures, e.g., between about 50 and 200 degrees Celsius) for a duration of time. In some embodiments, the bonding material 540 may be an adhesive material that ensures attachment of the IC structures 401 and 402 to one another. In some embodiments, the bonding material 540 may be an ES material. In some embodiments, the bonding material may be both an ES material and have suitable adhesive properties to ensure attachment of the IC structures 401 and 402 to one another. Thus, in some embodiments, the bonding material 540 may be the bonding interface 440, shown in FIGS. 4B and 4C. In other embodiments, no bonding material 540 may be used, in which case the layer labeled "540" in FIGS. 7A-7D and other drawings may represent a bonding interface 440 resulting from the bonding of the IC structures 401 and 402 to one another. Such a bonding interface may be recognizable as a seam or a thin layer in the IC devices 400B and 400C, using, e.g., selective area diffraction (SED), even when the specific materials of the insulators of the IC structures 401 and 402 that are bonded together may be the same, in which case the bonding interface would still be noticeable as a seam or a thin layer in what otherwise appears as a bulk insulator (e.g., bulk oxide) layer. As used herein, unless specified otherwise, references to the "bonding material 540" are applicable to a "bonding interface" for the embodiments where no deliberately added adhesive material is used to bond the IC structures 401 and 402.

Although not specifically shown in the present drawings, any embodiments of the IC devices 700 as described herein may further include one or more ES materials that may be included in the IC structure 401, e.g., between some or all pairs of metal layers of a metallization stack of the IC structure 401, and/or in the IC structure 402, e.g., between some or all pairs of metal layers of a metallization stack of the IC structure 402. Such layers of ES materials are commonly used in the field of semiconductor manufacturing and may be provided at different locations of the IC structures 401, 402, the locations being dependent on, e.g., specific processing techniques used to manufacture portions of these IC structures. In some embodiments, because the IC structures 401, 402 may be fabricated by different manufacturers, using different materials, or different manufacturing techniques, the material compositions of their ES materials may be different. For example, the ES material included in the IC structure 401 may include a material with silicon and nitrogen (e.g., silicon nitride), while the ES material included in the IC structure 402 may include a material with silicon and carbon (e.g., silicon carbide), or one of the ES materials included in the IC structures 401, 402 may include a material with aluminum and oxygen (e.g., aluminum oxide). Furthermore, the bonding material 540 at the interface between the IC structures 401 and 402 may have a material composition different from one or both of the ES material included in the IC structure 401 and the ES material included in the IC structure 402. For example, in some embodiments, the bonding material 540 may include silicon, nitrogen, and carbon, where the atomic percentage of any of these materials may be at least 1%, e.g., between about 1% and 50%, indicating that these elements are added deliberately, as opposed to being accidental impurities which are typically in concentration below about 0.1%. Having both nitrogen and carbon in these concentrations in addition to silicon is not typically used in conventional semiconductor manufacturing processes where, typically, either nitrogen or carbon is used in combination with silicon, and, therefore, would be a characteristic feature of the hybrid manufacturing as described herein. Using an ES material at the interface between the IC structures 401 and 402 that includes include silicon, nitrogen, and carbon, where the atomic percentage of any of these materials may be at least 1%, e.g., SiOCN, may be advantageous in terms that such a material may act both as an ES material, and have sufficient adhesive properties to bond the IC structures 401 and 402 together. In addition, an ES material at the interface between the IC structures 401 and 402 that includes include silicon, nitrogen, and carbon, where the atomic percentage of any of these materials may be at least 1%, may be advantageous in terms of improving etch-selectivity of this material with respect to the ES materials of the IC structures 401 and 402.

As shown in FIG. 7A, the back-side structure 410 is provided on the back side 534-1 of the IC structure 401. In order for the back-side structure 410 provided on the back side 534-1 of the IC structure 401 to be able to provide power to not only the backend memory of the IC structure 401 but also the backend memory of the IC structure 402, an after-bonding via 730 may be provided, the after-bonding via 730 configured to couple one or more of the back side interconnects 518 to any of the memory cells 520 of the backend memory of the IC structure 401 and any of the memory cells 520 of the backend memory of the IC structure 402. As shown in FIG. 7A, in some embodiments, the after-bonding via 730 may extend from the back side 534-1 of the IC structure 402 towards and reaching the front side 534-2 of the IC structure 402, extending through the bonding material 540, and further extending from the front side 534-2 of the IC structure 401 towards and reaching the back side 534-1 of the IC structure 401, and further extending into the back-side insulator 516 to make an electrical contact with at least one back-side interconnect 518 of the back-side structure 410. Although not specifically shown in FIG. 7A in order to not clutter the drawing, the after-bonding via 730 may be coupled to the memory cells of the IC structures 401, 402, as well as to any other components of the IC structures 401, 402 (e.g., to their frontend transistors 504), in order to provide power to these components. In various embodiments, the interconnects 508 of the IC structures 401 and 402, the back-side interconnects 518, and the after-bonding via 730 may be implemented as described above for the interconnects 508, the back-side interconnects 518, and the via 530.

FIG. 7A illustrates an embodiment of f2f bonding of the IC structures 401, 402 with a support structure 502 of the top IC structure (i.e., the IC structure 402) being removed. This may be done by using any suitable grinding or polishing process to reduce the thickness of the support structure 502 of the IC structure 402 after the bonding of the IC structures 401 and 402 has been performed. Thus, the back side 534-1 of the IC structure 402 in the embodiment of FIG. 7A may be the back side of the FEOL layer 420-2 of the IC structure 402, as shown in FIG. 7A. In other embodiments, some or all of the support structure 502 of the IC structure 402 may remain, as is shown in an IC device 700B of FIG. 7B, which means that the back side 534-1 of the IC structure 402 in the embodiment of FIG. 7B may be the back side of the support structure 502 of the IC structure 402. For such embodiments, the after-bonding via 730 may be provided from the back side of the support structure 502 of the IC structure 402, as is shown in FIG. 7B. Otherwise, the IC device 700B may be substantially the same as the IC device 700A, described above.

An IC device 700C shown in FIG. 7C is similar to the IC device 700B, except that the IC device 700C is an f2b-bonded assembly of the IC structures 401 and 402 because the back side 534-1 of the IC structure 402 is bonded to the front side 534-2 of the IC structure 401. Thus, in an f2b-bonded assembly, none of the IC structures 401, 402 is flipped upside down for bonding so that the bottom face of one of the IC structures is facing and is bonded to the top face of the other IC structure. For such embodiments, the after-bonding via 730 may extend from the front side 534-2 of the IC structure 402 towards and reaching the back side 534-1 of the IC structure 402 (which, for the embodiment shown in FIG. 7C is the back side of the support structure 502 of the IC structure 402), extending through the bonding material 540, and further extending from the front side 534-2 of the IC structure 401 towards and reaching the back side 534-1 of the IC structure 401, and further extending into the back-side insulator 516 to make an electrical contact with at least one back-side interconnect 518 of the back-side structure 410. Otherwise, the IC device 700C may be substantially the same as the IC device 700B, described above.

An IC device 700D shown in FIG. 7D is similar to the IC device 700C, i.e., the IC device 700D is an f2b-bonded assembly of the IC structures 401 and 402, except that the support structure 502 of the IC structure 700D has been removed prior to performing the f2b bonding of the IC structures 401 and 402. For such embodiments, the after-bonding via 730 may extend from the front side 534-2 of the IC structure 402 towards and reaching the back side 534-1 of the IC structure 402 (which, for the embodiment shown in FIG. 7D is the back side of the FEOL layer 420-2 of the IC structure 402), extending through the bonding material 540, and further extending from the front side 534-2 of the IC structure 401 towards and reaching the back side 534-1 of the IC structure 401, and further extending into the back-side insulator 516 to make an electrical contact with at least one back-side interconnect 518 of the back-side structure 410. Otherwise, the IC device 700D may be substantially the same as the IC device 700C, described above.

FIGS. 8A-8B provide cross-sectional side views at different stages of fabricating an IC device with multiple IC structures bonded together and with back-side reveal for power delivery to backend memory (e.g., any of the IC devices 700 shown in FIGS. 7A-7D), according to some embodiments of the present disclosure. The example fabrication method shown in FIGS. 8A-8B may include other operations not specifically shown in FIGS. 8A-8B, such as various cleaning or planarization operations as known in the art, e.g., as described above with reference to FIGS. 6A-6F.

The fabrication method for forming an IC device with multiple IC structures bonded together may begin with processes 602-610 as described above, in which the first IC structure 401 with the back-side structure 410 is formed, and with performing the process 602 to also form the second IC structure 402, separately from the IC structure 401. In the interests of brevity, these processes are not described or shown in FIGS. 8A-8B. The fabrication method may then proceed with a process 802, shown in FIG. 8A, that includes bringing the IC structure 402 into contact with the IC structure 401 so that their opposing faces may be bonded together as described above. FIG. 8A illustrates an embodiment of an f2f bonding of the IC structures 401, 402, but the same process may be performed by first, flipping the IC structure 402 over with respect to the illustration of FIG. 8A so that the back side 534-1 of the IC structure 402 is bonded to the front side 534-2 of the IC structure 401 according to any of the f2b embodiments described herein. FIG. 8A illustrates an embodiment of an f2f bonding of the IC structures 401, 402 where the IC structure 402 does not include a support structure 502, but, in other embodiments of the process 802, the IC structure 402 may include the support structure 502, e.g., as shown in FIG. 7B, which support structure may be removed after the bonding of the IC structures 401, 402, and before the after-bonding via 730 is provided.

The fabrication method may further include a process 804, shown in FIG. 8B, that includes providing an after-bonding via 730 as described above, after the IC structures 401 and 402 have been bonded together. Again, FIG. 8B illustrates an embodiment of forming the after-bonding via 730 after the f2f bonding of the IC structures 401, 402 where the IC structure 402 does not include a support structure 502, but, in other embodiments of the process 804, the IC structure 402 may include the support structure 502, e.g., as shown in FIG. 7B, and the after-bonding via 730 may be formed from the back of the support structure 502 as in FIG. 7B. Still in other embodiments, the IC structure 402 may be bonded to the IC structure 401 in ab f2b arrangement, in which case the after-bonding via 730 may be formed from the front side 534-2 of the IC structure 402 as in FIG. 7C or FIG. 7D.

Similar to the IC devices with single IC structures, e.g., the IC devices 500A and 500B, because of different fabrication processes being performed on different sides during the fabrication of the IC devices 700A-700D, in some embodiments, these devices may exhibit characteristic features indicative of the fabrication method as described with reference to FIGS. 8A-8B. In particular, examining the trapezoidal cross-sectional shapes of the interconnects 508, the back-side interconnects 518, and the after-bonding via 730 may reveal characteristic features of the fabrication method as shown in FIGS. 8A-8B being used to manufacture IC devices as shown in FIGS. 7A-7D. For example, for all of the IC devices 700, the short sides of the trapezoidal cross-sections of the interconnects 508 of the first IC structure 401 may be closer to the back-side structure 410 than their long sides, or, phrased differently, the long sides of the trapezoidal cross-sections of the interconnects 508 of the first IC structure 401 may be closer to the bonding interface 440 than their short sides. Furthermore, for all of the IC devices 700, the short sides of the trapezoidal cross-sections of the back-side interconnects 518 may be closer to the FEOL layer 420-1 of the IC structure 401 and to the bonding interface 440 than their long sides, or, phrased differently, the long sides of the trapezoidal cross-sections of the back-side interconnects 518 may be further away from to the bonding interface 440 than their short sides. For the f2f bonding arrangements of the IC structures 401 and 402 (e.g., for the IC devices 700A or 700B), the long sides of the trapezoidal cross-sections of the interconnects 508 of the second IC structure 402 may be closer to the bonding interface 440 than their short sides and the short side of the trapezoidal cross-section of the after-bonding via 730 may be closer to the back-side structure 410 than its' long side, or, phrased differently, the long side of the trapezoidal cross-section of the after-bonding via 730 may be at the back side 534-1 of the second IC structure 402, while the short side of the trapezoidal cross-section of the after-bonding via 730 may be in contact with one or more of the back-side interconnects 518. On the other hand, for the f2b bonding arrangements of the IC structures 401 and 402 (e.g., for the IC devices 700C or 700D), the short sides of the trapezoidal cross-sections of the interconnects 508 of the second IC structure 402 may be closer to the bonding interface 440 than their long sides, while the short side of the trapezoidal cross-section of the after-bonding via 730 may still be closer to the back-side structure 410 than its' long side, or, phrased differently, the long side of the trapezoidal cross-section of the after-bonding via 730 may be at the front side 534-2 of the second IC structure 402, while the short side of the trapezoidal cross-section of the after-bonding via 730 may be in contact with one or more of the back-side interconnects 518.

IC devices with back-side reveal for power delivery to backend memory as disclosed herein may be included in any suitable electronic device. FIGS. 9-13 illustrate various examples of devices and components that may include one or more IC devices with back-side reveal for power delivery to backend memory as disclosed herein.

Figures 9A, 9B:
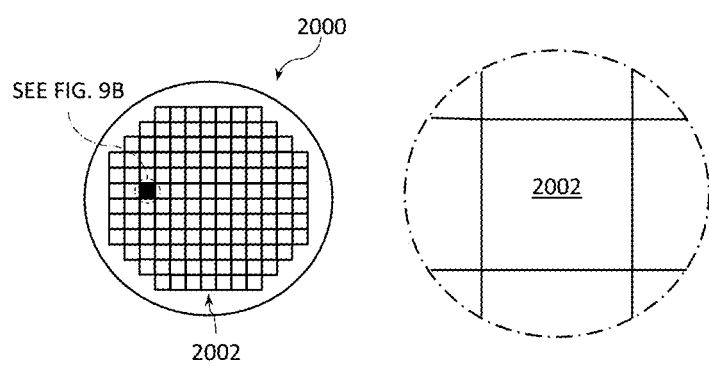
FIGS. 9A-9B are top views of a wafer and dies that may include IC devices with back-side reveal for power delivery to backend memory in accordance with any of the embodiments disclosed herein.

FIGS. 9A-9B are top views of a wafer 2000 and dies 2002 that may include one or more IC devices with back-side reveal for power delivery to backend memory in accordance with any of the embodiments disclosed herein. In some embodiments, the dies 2002 may be included in an IC package, in accordance with any of the embodiments disclosed herein. For example, any of the dies 2002 may serve as any of the dies 2256 in an IC package 2200 shown in FIG. 11. The wafer 2000 may be composed of semiconductor material and may include one or more dies 2002 having IC structures formed on a surface of the wafer 2000. Each of the dies 2002 may be a repeating unit of a semiconductor product that includes any suitable IC (e.g., ICs including structures implemented with back-side reveal for power delivery to backend memory as described herein). After the fabrication of the semiconductor product is complete (e.g., after manufacture of one or more IC devices with back-side reveal for power delivery to backend memory as described herein, e.g., any embodiment of the IC devices with back-side reveal for power delivery to backend memory, described herein), the wafer 2000 may undergo a singulation process in which each of the dies 2002 is separated from one another to provide discrete "chips" of the semiconductor product. In particular, devices that include IC structures with back-side reveal for power delivery to backend memory as disclosed herein may take the form of the wafer 2000 (e.g., not singulated) or the form of the die 2002 (e.g., singulated). The die 2002 may include one or more transistors (e.g., one or more frontend transistors 504 of the FEOL layer 420 and one or more transistors 510 of the BEOL layer 430, as described herein and/or one or more frontend transistors 2140 of FIG. 10, discussed below), one or more memory cells (e.g., one or more 1T-1C memory cells or any other backend memory cells as described herein), and/or supporting circuitry (e.g., one or more interconnects as described herein) to route electrical signals to the transistors and/or the memory cells, as well as any other IC components. In some embodiments, the wafer 2000 or the die 2002 may implement or include a memory device, a logic device (e.g., an AND, OR, NAND, or NOR gate), or any other suitable circuit element. Multiple ones of these devices may be combined on a single die 2002. For example, a memory array formed by multiple memory cells in a given layer may be formed on a same die 2002 as a processing device (e.g., the processing device 2402 of FIG. 13) or other logic that is configured to store information in the memory devices or execute instructions stored in the memory array.

Figure 10:
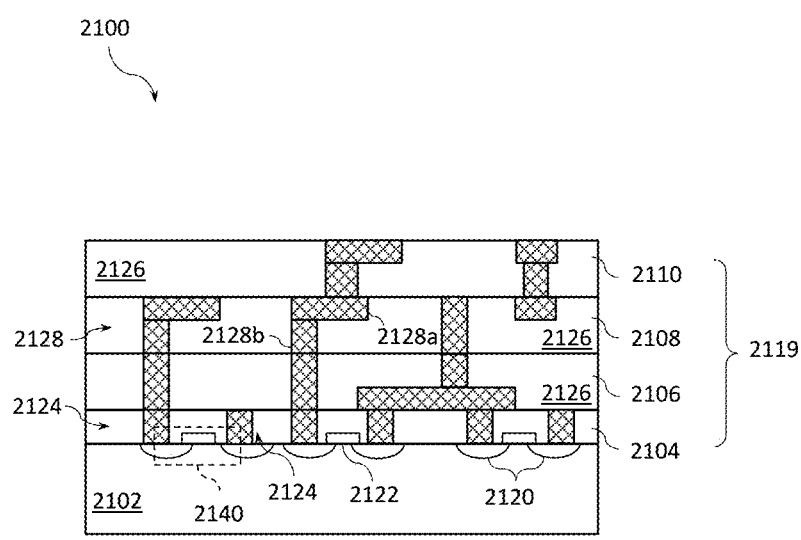
FIG. 10 is a cross-sectional side view of one side of an IC device that may implement back-side reveal for power delivery to backend memory in accordance with any of the embodiments disclosed herein.

FIG. 10 is a cross-sectional side view of one side of an IC device 2100 that may be an IC device with back-side reveal for power delivery to backend memory in accordance with any of the embodiments disclosed herein. For example, the IC device 2100 may form basis for fabricating any of the IC devices 400, 500, or 700, described above, i.e., may form basis for fabricating an IC device with back-side reveal for power delivery to backend memory, as described herein. In particular, the backend memory as described herein may be implemented in any of the backend layers of the IC device 2100, e.g., in any of the interconnect layers 2106-2110 shown in FIG. 10. Because there are various possibilities where such backend memory may be integrated in the IC device 2100, the backend memory is not specifically shown in FIG. 10. In some embodiments, the IC device 2100 may serve as any of the dies 2256 in the IC package 2300.

As shown in FIG. 10, the IC device 2100 may include a back-side power delivery structure 2102 over which one or more device layers 2104 are provided. The back-side power delivery structure 2102 may be implemented as the back-side structure 410, described above. The device layers 2104 provide one example of one or more layers with the frontend transistors 504 of the FEOL layer 420, described above. The device layer 2104 may include features of one or more transistors 2140 (e.g., metal oxide semiconductor field-effect transistors (MOSFETs)) formed on the substrate 2102. The transistors 2140 provide one example of any of the frontend transistors 504, described above. The device layer 2104 may include, for example, one or more S/D regions 2120, a gate 2122 to control current flow in the transistors 2140 between the S/D regions 2120, and one or more S/D contacts 2124 to route electrical signals to/from the S/D regions 2120. The transistors 2140 may include additional features not depicted for the sake of clarity, such as device isolation regions, gate contacts, and the like.

Each transistor 2140 may include a gate 2122 formed of at least two layers, a gate dielectric layer and a gate electrode layer. Generally, the gate dielectric layer of a transistor 2140 may include one layer or a stack of layers, and may include any of the materials described above with reference to the gate dielectric 216. In some embodiments, an annealing process may be carried out on the gate dielectric of the gate 2122 to improve its quality when a high-k material is used.

The gate electrode may be formed on the gate dielectric and may include at least one P-type work function metal or N-type work function metal, depending on whether the transistor 2140 is to be a PMOS or an NMOS transistor. In some implementations, the gate electrode may include a stack of two or more metal layers, where one or more metal layers are work function metal layers and at least one metal layer is a fill metal layer. Further metal layers may be included for other purposes, such as a barrier layer. The gate electrode of the gate 2122 may include any of the materials described above with reference to the gate electrode 214.

In some embodiments, when viewed as a cross-section of the transistor 2140 along the source-channel-drain direction, the gate electrode of the gate 2122 may include a U-shaped structure that includes a bottom portion substantially parallel to the surface of the substrate and two sidewall portions that are substantially perpendicular to the top surface of the substrate. In other embodiments, at least one of the metal layers that form the gate electrode may simply be a planar layer that is substantially parallel to the top surface of the substrate and does not include sidewall portions substantially perpendicular to the top surface of the substrate. In other embodiments, the gate electrode may include a combination of U-shaped structures and planar, non-U-shaped structures. For example, the gate electrode may include one or more U-shaped metal layers formed atop one or more planar, non-U-shaped layers. In some embodiments, the gate electrode may include a V-shaped structure (e.g., when the fin of a FinFET does not have a "flat" upper surface, but instead has a rounded peak).

In some embodiments, a pair of sidewall spacers may be formed on opposing sides of the gate stack to bracket the gate stack. The sidewall spacers may be formed from a material such as silicon nitride, silicon oxide, silicon carbide, silicon nitride doped with carbon, and silicon oxynitride. Processes for forming sidewall spacers are well known in the art and generally include deposition and etching process steps. In some embodiments, a plurality of spacer pairs may be used; for instance, two pairs, three pairs, or four pairs of sidewall spacers may be formed on opposing sides of the gate stack.

The S/D regions 2120 may be adjacent to the gate of each transistor 2140. The S/D regions 2120 may be formed using an implantation/diffusion process or an etching/deposition process, for example.

Various transistors 2140 are not limited to the type and configuration depicted in FIG. 10 and may include a wide variety of other types and configurations such as, for example, planar transistors, non-planar transistors (e.g., FinFETs, nanowire, or nanoribbon transistors), or a combination of transistors of different types and configurations.

The one or more interconnect layers 2106-2110 may form an ILD stack 2119 of the IC device 2100. In some embodiments, electrical signals, such as power and/or input/output (I/O) signals, may be routed to and/or from the transistors 2140 of the device layer 2104 and/or to backend memory implemented in the ILD stack 2119 of the IC device 2100 through one or more interconnect layers disposed on the device layer 2104 (illustrated in FIG. 10 as interconnect layers 2106-2110). For example, electrically conductive features of the device layer 2104 (e.g., the gate 2122 and the S/D contacts 2124) may be electrically coupled with the interconnect structures 2128 of the interconnect layers 2106-2110.

The interconnect structures 2128 may be arranged within the interconnect layers 2106-1210 to route electrical signals according to a wide variety of designs (in particular, the arrangement is not limited to the particular configuration of interconnect structures 2128 depicted in FIG. 10). Although a particular number of interconnect layers 2106-1210 is depicted in FIG. 10, embodiments of the present disclosure include IC devices having more or fewer interconnect layers than depicted.

In some embodiments, the interconnect structures 2128 may include trench structures 2128*a* (sometimes referred to as "lines") and/or via structures 2128B (sometimes referred to as "holes") filled with an electrically conductive material such as a metal. The trench structures 2128*a* may be arranged to route electrical signals in a direction of a plane that is substantially parallel with a surface of the substrate 2102 upon which the device layer 2104 is formed. For example, the trench structures 2128*a* may route electrical signals in a direction in and out of the page from the perspective of FIG. 10. The via structures 2128B may be arranged to route electrical signals in a direction of a plane that is substantially perpendicular to the surface of the substrate 2102 upon which the device layer 2104 is formed. In some embodiments, the via structures 2128B may electrically couple trench structures 2128*a* of different interconnect layers 2106-2110 together.

The interconnect layers 2106-2110 may include a dielectric material 2126 disposed between the interconnect structures 2128, as shown in FIG. 10. In some embodiments, the dielectric material 2126 disposed between the interconnect structures 2128 in different ones of the interconnect layers 2106-2110 may have different compositions; in other embodiments, the composition of the dielectric material 2126 between different interconnect layers 2106-2110 may be the same. The dielectric material 2126 may include any of the insulator/dielectric materials described above.

A first interconnect layer 2106 (referred to as Metal 1 or "M1") may be formed directly on the device layer 2104. In some embodiments, the first interconnect layer 2106 may include trench structures 2128*a* and/or via structures 2128B, as shown. The trench structures 2128*a* of the first interconnect layer 2106 may be coupled with contacts (e.g., the S/D contacts 2124) of the device layer 2104.

A second interconnect layer 2108 (referred to as Metal 2 or "M2") may be formed directly on the first interconnect layer 2106. In some embodiments, the second interconnect layer 2108 may include via structures 2128B to couple the trench structures 2128*a* of the second interconnect layer 2108 with the trench structures 2128*a* of the first interconnect layer 2106. Although the trench structures 2128*a* and the via structures 2128B are structurally delineated with a line within each interconnect layer (e.g., within the second interconnect layer 2108) for the sake of clarity, the trench structures 2128*a* and the via structures 2128B may be structurally and/or materially contiguous (e.g., simultaneously filled during a dual-damascene process) in some embodiments.

A third interconnect layer 2110 (referred to as Metal 3 or "M3") (and additional interconnect layers, as desired) may be formed in succession on the second interconnect layer 2108 according to similar techniques and configurations described in connection with the second interconnect layer 2108 or the first interconnect layer 2106.

The interconnect layers 2106-2110 may be the metal layers M1-M3, described above. Further metal layers may be present in the IC device 2100, as also described above.

In some embodiments, electrical signals, such as power and/or I/O signals, may be routed to and/or from the transistors 2140 of the device layer 2104 and/or to backend memory implemented in the ILD stack 2119 of the IC device 2100 from the back-side power delivery structure 2102, as described above.

The IC device 2100 may be formed on the wafer 2000 of FIG. 9A and may be included in a die, e.g., the die 2002 of FIG. 9B.

Figure 11:
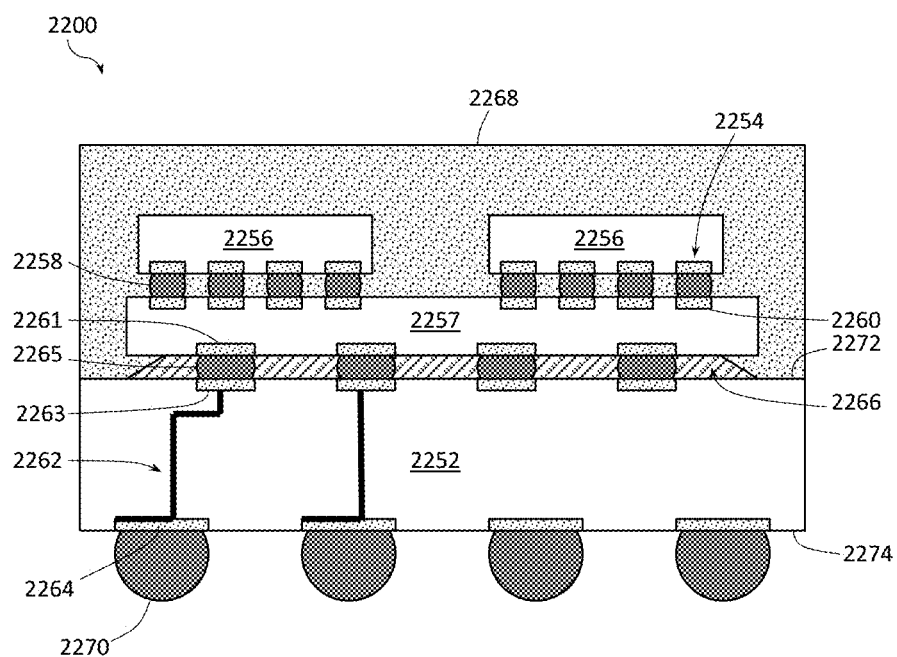
FIG. 11 is a cross-sectional side view of an IC package that may include one or more IC devices with back-side reveal for power delivery to backend memory in accordance with any of the embodiments disclosed herein.

FIG. 11 is a side, cross-sectional view of an example IC package 2200 that may include IC devices with back-side reveal for power delivery to backend memory in accordance with any of the embodiments disclosed herein. In some embodiments, the IC package 2200 may be a system-in-package (SiP).

The package substrate 2252 may be formed of a dielectric material (e.g., a ceramic, a buildup film, an epoxy film having filler particles therein, etc.), and may have conductive pathways extending through the dielectric material between the face 2272 and the face 2274, or between different locations on the face 2272, and/or between different locations on the face 2274. These conductive pathways may take the form of any of the interconnect structures 2128 discussed above with reference to FIG. 10.

The package substrate 2252 may include conductive contacts 2263 that are coupled to conductive pathways 2262 through the package substrate 2252, allowing circuitry within the dies 2256 and/or the interposer 2257 to electrically couple to various ones of the conductive contacts 2264 (or to other devices included in the package substrate 2252, not shown).

The IC package 2200 may include an interposer 2257 coupled to the package substrate 2252 via conductive contacts 2261 of the interposer 2257, first-level interconnects 2265, and the conductive contacts 2263 of the package substrate 2252. The first-level interconnects 2265 illustrated in FIG. 11 are solder bumps, but any suitable first-level interconnects 2265 may be used. In some embodiments, no interposer 2257 may be included in the IC package 2200; instead, the dies 2256 may be coupled directly to the conductive contacts 2263 at the face 2272 by first-level interconnects 2265.

The IC package 2200 may include one or more dies 2256 coupled to the interposer 2257 via conductive contacts 2254 of the dies 2256, first-level interconnects 2258, and conductive contacts 2260 of the interposer 2257. The conductive contacts 2260 may be coupled to conductive pathways (not shown) through the interposer 2257, allowing circuitry within the dies 2256 to electrically couple to various ones of the conductive contacts 2261 (or to other devices included in the interposer 2257, not shown). The first-level interconnects 2258 illustrated in FIG. 11 are solder bumps, but any suitable first-level interconnects 2258 may be used. As used herein, a "conductive contact" may refer to a portion of electrically conductive material (e.g., metal) serving as an interface between different components; conductive contacts may be recessed in, flush with, or extending away from a surface of a component, and may take any suitable form (e.g., a conductive pad or socket). For any of the dies 2256 implemented as an IC device with back-side reveal for power delivery to backend memory as described herein, the conductive contacts 2254 may be coupled to the back-side interconnects 518 of the back-side structure 410 that are in the interconnect layer that is farthest away from the FEOL layer 420 on which the back-side structure 410 is provided (i.e., the conductive contacts 2254 may be coupled to the back-side interconnects 518 that are exposed at the back of the die 2256). Thus, the power may be provided to the backend memory in the dies 2256, via the back-side interconnects 518, from the interposer 2257.

In some embodiments, an underfill material 2266 may be disposed between the package substrate 2252 and the interposer 2257 around the first-level interconnects 2265, and a mold compound 2268 may be disposed around the dies 2256 and the interposer 2257 and in contact with the package substrate 2252. In some embodiments, the underfill material 2266 may be the same as the mold compound 2268. Example materials that may be used for the underfill material 2266 and the mold compound 2268 are epoxy mold materials, as suitable. Second-level interconnects 2270 may be coupled to the conductive contacts 2264. The second-level interconnects 2270 illustrated in FIG. 11 are solder balls (e.g., for a ball grid array arrangement), but any suitable second-level interconnects 22770 may be used (e.g., pins in a pin grid array arrangement or lands in a land grid array arrangement). The second-level interconnects 2270 may be used to couple the IC package 2200 to another component, such as a circuit board (e.g., a motherboard), an interposer, or another IC package, as known in the art and as discussed below with reference to FIG. 12.

In some embodiments, the dies 2256 may take the form of any of the embodiments of the die 2002 discussed herein (e.g., may include any of the embodiments of the IC device 2100). In embodiments in which the IC package 2200 includes multiple dies 2256, the IC package 2200 may be referred to as a multi-chip package (MCP). The dies 2256 may include circuitry to perform any desired functionality. For example, one or more of the dies 2256 may be logic dies (e.g., silicon-based dies), and one or more of the dies 2256 may be memory dies (e.g., high bandwidth memory), including embedded memory dies as described herein. In some embodiments, any of the dies 2256 may include IC devices with back-side reveal for power delivery to backend memory, e.g., as discussed above; in some embodiments, at least some of the dies 2256 may not include any IC devices with back-side reveal for power delivery to backend memory.

The IC package 2200 illustrated in FIG. 11 may be a flip chip package, although other package architectures may be used. For example, the IC package 2200 may be a ball grid array (BGA) package, such as an embedded wafer-level ball grid array (eWLB) package. In another example, the IC package 2200 may be a wafer-level chip scale package (WLCSP) or a panel fan-out (FO) package. Although two dies 2256 are illustrated in the IC package 2200 of FIG. 11, an IC package 2200 may include any desired number of the dies 2256. An IC package 2200 may include additional passive components, such as surface-mount resistors, capacitors, and inductors disposed on the first face 2272 or the second face 2274 of the package substrate 2252, or on either face of the interposer 2257. More generally, an IC package 2200 may include any other active or passive components known in the art.

Figure 12:
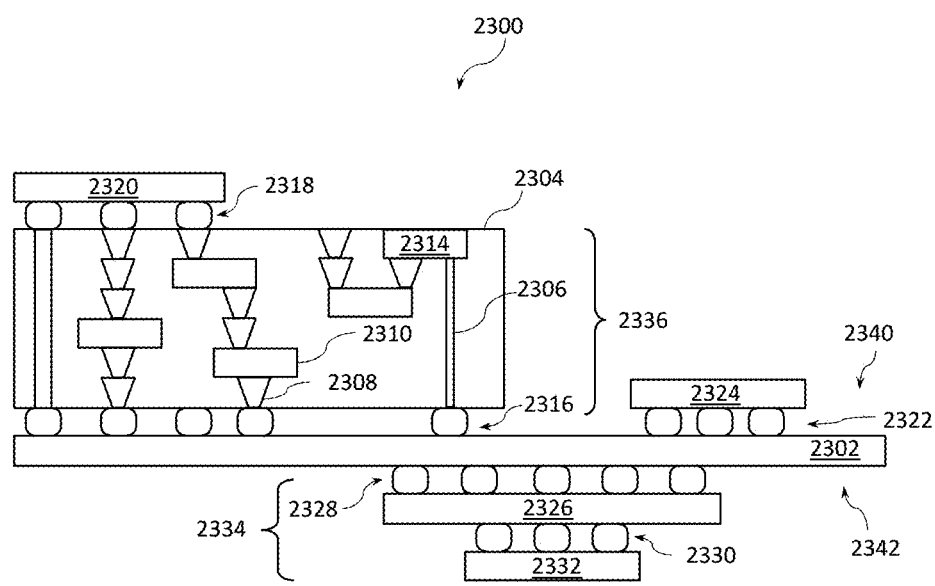
FIG. 12 is a cross-sectional side view of an IC device assembly that may include one or more IC devices with back-side reveal for power delivery to backend memory in accordance with any of the embodiments disclosed herein.

FIG. 12 is a cross-sectional side view of an IC device assembly 2300 that may include components having one or more IC devices with back-side reveal for power delivery to backend memory in accordance with any of the embodiments disclosed herein. The IC device assembly 2300 includes a number of components disposed on a circuit board 2302 (which may be, e.g., a motherboard). The IC device assembly 2300 includes components disposed on a first face 2340 of the circuit board 2302 and an opposing second face 2342 of the circuit board 2302; generally, components may be disposed on one or both faces 2340 and 2342. In particular, any suitable ones of the components of the IC device assembly 2300 may include any of one or more IC devices with back-side reveal for power delivery to backend memory in accordance with any of the embodiments disclosed herein; e.g., any of the IC packages discussed below with reference to the IC device assembly 2300 may take the form of any of the embodiments of the IC package 2200 discussed above with reference to FIG. 11 (e.g., may include one or more IC devices with back-side reveal for power delivery to backend memory provided on a die 2256).

In some embodiments, the circuit board 2302 may be a PCB including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 2302. In other embodiments, the circuit board 2302 may be a non-PCB substrate.

The IC device assembly 2300 illustrated in FIG. 12 includes a package-on-interposer structure 2336 coupled to the first face 2340 of the circuit board 2302 by coupling components 2316. The coupling components 2316 may electrically and mechanically couple the package-on-interposer structure 2336 to the circuit board 2302, and may include solder balls (e.g., as shown in FIG. 12), male and female portions of a socket, an adhesive, an underfill material, and/or any other suitable electrical and/or mechanical coupling structure.

The package-on-interposer structure 2336 may include an IC package 2320 coupled to an interposer 2304 by coupling components 2318. The coupling components 2318 may take any suitable form for the application, such as the forms discussed above with reference to the coupling components 2316. The IC package 2320 may be or include, for example, a die (the die 2002 of FIG. 9B), an IC device (e.g., the IC device 2100 of FIG. 10), or any other suitable component. In particular, the IC package 2320 may include one or more IC devices with back-side reveal for power delivery to backend memory as described herein. Although a single IC package 2320 is shown in FIG. 12, multiple IC packages may be coupled to the interposer 2304; indeed, additional interposers may be coupled to the interposer 2304. The interposer 2304 may provide an intervening substrate used to bridge the circuit board 2302 and the IC package 2320. Generally, the interposer 2304 may spread a connection to a wider pitch or reroute a connection to a different connection. For example, the interposer 2304 may couple the IC package 2320 (e.g., a die) to a BGA of the coupling components 2316 for coupling to the circuit board 2302. In the embodiment illustrated in FIG. 12, the IC package 2320 and the circuit board 2302 are attached to opposing sides of the interposer 2304; in other embodiments, the IC package 2320 and the circuit board 2302 may be attached to the same side of the interposer 2304. In some embodiments, three or more components may be interconnected by way of the interposer 2304.

The interposer 2304 may be formed of an epoxy resin, a fiberglass-reinforced epoxy resin, a ceramic material, or a polymer material such as polyimide. In some implementations, the interposer 2304 may be formed of alternate rigid or flexible materials that may include the same materials described above for use in a semiconductor substrate, such as silicon, germanium, and other group III-V and group IV materials. The interposer 2304 may include metal interconnects 2308 and vias 2310, including but not limited to through-silicon vias (TSVs) 2306. The interposer 2304 may further include embedded devices 2314, including both passive and active devices. Such devices may include, but are not limited to, capacitors, decoupling capacitors, resistors, inductors, fuses, diodes, transformers, sensors, electrostatic discharge (ESD) protection devices, and memory devices. More complex devices such as radio frequency (RF) devices, power amplifiers, power management devices, antennas, arrays, sensors, and microelectromechanical systems (MEMS) devices may also be formed on the interposer 2304. The package-on-interposer structure 2336 may take the form of any of the package-on-interposer structures known in the art.

The IC device assembly 2300 may include an IC package 2324 coupled to the first face 2340 of the circuit board 2302 by coupling components 2322. The coupling components 2322 may take the form of any of the embodiments discussed above with reference to the coupling components 2316, and the IC package 2324 may take the form of any of the embodiments discussed above with reference to the IC package 2320.

The IC device assembly 2300 illustrated in FIG. 12 includes a package-on-package structure 2334 coupled to the second face 2342 of the circuit board 2302 by coupling components 2328. The package-on-package structure 2334 may include an IC package 2326 and an IC package 2332 coupled together by coupling components 2330 such that the IC package 2326 is disposed between the circuit board 2302 and the IC package 2332. The coupling components 2328 and 2330 may take the form of any of the embodiments of the coupling components 2316 discussed above, and the IC packages 2326 and 2332 may take the form of any of the embodiments of the IC package 2320 discussed above. The package-on-package structure 2334 may be configured in accordance with any of the package-on-package structures known in the art.

Figure 13:
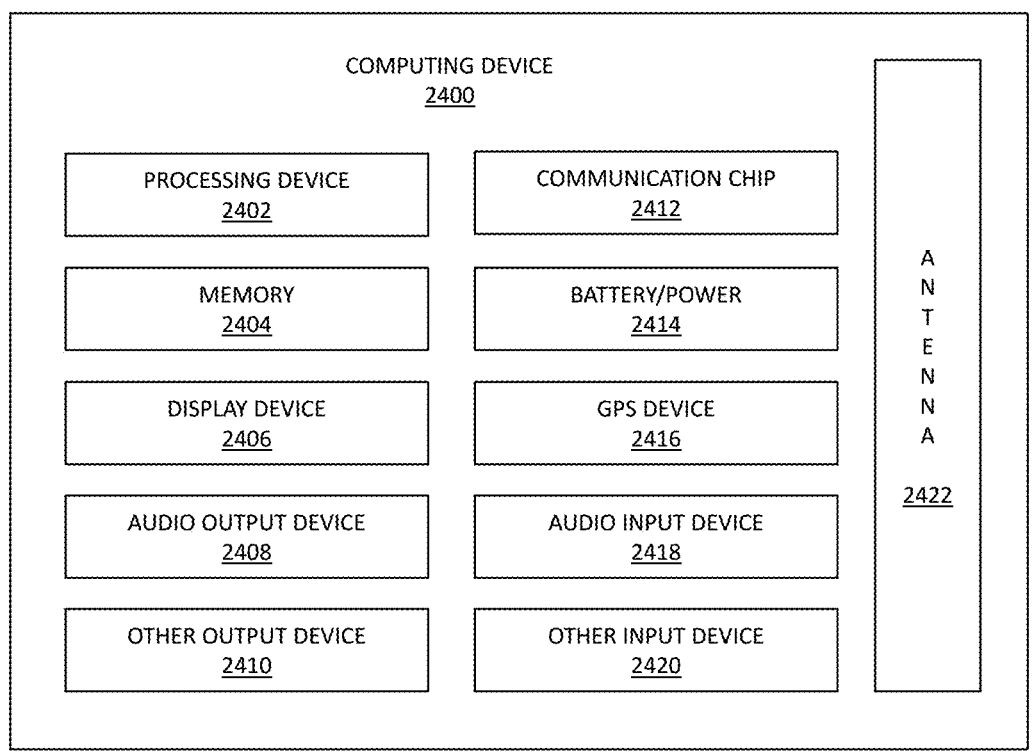
FIG. 13 is a block diagram of an example computing device that may include one or more IC devices with back-side reveal for power delivery to backend memory in accordance with any of the embodiments disclosed herein.

FIG. 13 is a block diagram of an example computing device 2400 that may include one or more components with one or more IC devices with back-side reveal for power delivery to backend memory in accordance with any of the embodiments disclosed herein. For example, any suitable ones of the components of the computing device 2400 may include a die (e.g., the die 2002 (FIG. 9B)) including IC device with back-side reveal for power delivery to backend memory in accordance with any of the embodiments disclosed herein. Any of the components of the computing device 2400 may include an IC device 2100 (FIG. 10) and/or an IC package 2200 (FIG. 11). Any of the components of the computing device 2400 may include an IC device assembly 2300 (FIG. 12).

A number of components are illustrated in FIG. 13 as included in the computing device 2400, but any one or more of these components may be omitted or duplicated, as suitable for the application. In some embodiments, some or all of the components included in the computing device 2400 may be attached to one or more motherboards. In some embodiments, some or all of these components are fabricated onto a single SoC die.

Additionally, in various embodiments, the computing device 2400 may not include one or more of the components illustrated in FIG. 13, but the computing device 2400 may include interface circuitry for coupling to the one or more components. For example, the computing device 2400 may not include a display device 2406, but may include display device interface circuitry (e.g., a connector and driver circuitry) to which a display device 2406 may be coupled. In another set of examples, the computing device 2400 may not include an audio input device 2418 or an audio output device 2408 but may include audio input or output device interface circuitry (e.g., connectors and supporting circuitry) to which an audio input device 2418 or audio output device 2408 may be coupled.

The computing device 2400 may include a processing device 2402 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 2402 may include one or more digital signal processors (DSPs), application-specific ICs (ASICs), central processing units (CPUs), graphics processing units (GPUs), cryptoprocessors (specialized processors that execute cryptographic algorithms within hardware), server processors, or any other suitable processing devices. The computing device 2400 may include a memory 2404, which may itself include one or more memory devices such as volatile memory (e.g., DRAM), nonvolatile memory (e.g., read-only memory (ROM)), flash memory, solid state memory, and/or a hard drive. In some embodiments, the memory 2404 may include memory that shares a die with the processing device 2402. This memory may be used as cache memory. The memory 2404 may include one or more IC devices with back-side reveal for power delivery to backend memory as described herein.

In some embodiments, the computing device 2400 may include a communication chip 2412 (e.g., one or more communication chips). For example, the communication chip 2412 may be configured for managing wireless communications for the transfer of data to and from the computing device 2400. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

The communication chip 2412 may implement any of a number of wireless standards or protocols, including but not limited to Institute for Electrical and Electronic Engineers (IEEE) standards including Wi-Fi (IEEE 602.11 family), IEEE 602.16 standards (e.g., IEEE 602.16-2005 Amendment), Long-Term Evolution (LTE) project along with any amendments, updates, and/or revisions (e.g., advanced LTE project, ultramobile broadband (UMB) project (also referred to as "3GPP2"), etc.). IEEE 602.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 602.16 standards. The communication chip 2412 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 2412 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 2412 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication chip 2412 may operate in accordance with other wireless protocols in other embodiments. The computing device 2400 may include an antenna 2422 to facilitate wireless communications and/or to receive other wireless communications (such as AM or FM radio transmissions).

In some embodiments, the communication chip 2412 may manage wired communications, such as electrical, optical, or any other suitable communication protocols (e.g., the Ethernet). As noted above, the communication chip 2412 may include multiple communication chips. For instance, a first communication chip 2412 may be dedicated to shorter-range wireless communications such as Wi-Fi or Bluetooth, and a second communication chip 2412 may be dedicated to longer-range wireless communications such as global positioning system (GPS), EDGE, GPRS, CDMA, WiMAX, LTE, EV-DO, or others. In some embodiments, a first communication chip 2412 may be dedicated to wireless communications, and a second communication chip 2412 may be dedicated to wired communications.

The computing device 2400 may include battery/power circuitry 2414. The battery/power circuitry 2414 may include one or more energy storage devices (e.g., batteries or capacitors) and/or circuitry for coupling components of the computing device 2400 to an energy source separate from the computing device 2400 (e.g., AC line power).

The computing device 2400 may include a display device 2406 (or corresponding interface circuitry, as discussed above). The display device 2406 may include any visual indicators, such as a heads-up display, a computer monitor, a projector, a touchscreen display, a liquid crystal display (LCD), a light-emitting diode display, or a flat panel display, for example.

The computing device 2400 may include an audio output device 2408 (or corresponding interface circuitry, as discussed above). The audio output device 2408 may include any device that generates an audible indicator, such as speakers, headsets, or earbuds, for example.

The computing device 2400 may include an audio input device 2418 (or corresponding interface circuitry, as discussed above). The audio input device 2418 may include any device that generates a signal representative of a sound, such as microphones, microphone arrays, or digital instruments (e.g., instruments having a musical instrument digital interface (MIDI) output).

The computing device 2400 may include a GPS device 2416 (or corresponding interface circuitry, as discussed above). The GPS device 2416 may be in communication with a satellite-based system and may receive a location of the computing device 2400, as known in the art.

The computing device 2400 may include an other output device 2410 (or corresponding interface circuitry, as discussed above). Examples of the other output device 2410 may include an audio codec, a video codec, a printer, a wired or wireless transmitter for providing information to other devices, or an additional storage device.

The computing device 2400 may include an other input device 2420 (or corresponding interface circuitry, as discussed above). Examples of the other input device 2420 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The computing device 2400 may have any desired form factor, such as a handheld or mobile computing device (e.g., a cell phone, a smart phone, a mobile internet device, a music player, a tablet computer, a laptop computer, a netbook computer, an ultrabook computer, a personal digital assistant (PDA), an ultramobile personal computer, etc.), a desktop computing device, a server or other networked computing component, a printer, a scanner, a monitor, a set-top box, an entertainment control unit, a vehicle control unit, a digital camera, a digital video recorder, or a wearable computing device. In some embodiments, the computing device 2400 may be any other electronic device that processes data.

Select Examples

The following paragraphs provide various examples of the embodiments disclosed herein.

Example 1 provides an IC device that includes an FEOL layer, including frontend transistors, the FEOL layer having a first face and an opposing second face; a BEOL layer, including backend memory cells; and a back-side structure, including back-side interconnects, where at least one of the back-side interconnects is electrically coupled to one or more of the backend memory cells to deliver power and/or signals and/or control commands to the backend memory cells, where the FEOL layer is between the BEOL layer and the back-side structure.

Example 2 provides the IC device according to example 1, where the IC device includes a first IC structure and a second IC structure, bonded to the first IC structure. In such an IC device, the BEOL layer is a first BEOL layer, the first IC structure includes the FEOL layer and the first BEOL layer, the second IC structure includes a second BEOL layer, including further backend memory cells, at least one of the back-side interconnects is electrically coupled to one or more of the further backend memory cells, and the first BEOL layer is between the FEOL layer and the second BEOL layer.

Example 3 provides the IC device according to example 2, further including a bonding interface between the second IC structure and the first IC structure, the bonding interface being between the first BEOL layer and the second BEOL layer (where the bonding interface may, but does not have to, be in contact with the second BEOL layer, i.e., there may be additional layers between the bonding interface and the second BEOL layer).

Example 4 provides the IC device according to example 3, where the bonding interface includes an oxide.

Example 5 provides the IC device according to example 3, where the bonding interface includes a bonding material that includes silicon and one or both of nitrogen and carbon.

Example 6 provides the IC device according to any one of examples 2-5, where each of the first IC structure and the second IC structure includes a first face and an opposing second face, the second IC structure is bonded to the first IC structure by having the first face of the second IC structure being bonded to the first face of the first IC structure, and the IC device further includes an after-bonding via extending from the second face of the second IC structure to, and being electrically coupled to, the at least one of the back-side interconnects that is coupled to the one or more of the further backend memory cells.

Example 7 provides the IC device according to example 6, where the after-bonding via extends through the second IC structure, through a bonding interface between the first IC structure and the second IC structure, and into the first IC structure.

Example 8 provides the IC device according to examples 6 or 7, where the at least one of the back-side interconnects is coupled to the one or more of the further backend memory cells by being coupled to the after-bonding via and the after-bonding via being coupled to the one or more of the further backend memory cells.

Example 9 provides the IC device according to any one of examples 6-8, where the back-side structure includes a first face and an opposing second face, the first face of the back-side structure is closer to the second face of the first IC structure than the second face of the back-side structure (i.e., the second face of the back-side structure is the back side of the back-side structure), and, in a plane that is substantially perpendicular to a bonding interface between the first IC structure and the second IC structure (or in a plane that is substantially perpendicular to the back-side structure), each of a cross-section of the after-bonding via and a cross-section of at least one of the back-side interconnects is a trapezoid that includes two parallel sides, one of which is a short side and another one of which is a long side. In such an IC device, for the trapezoid of the cross-section of the after-bonding via, the short side is closer to the second face of the back-side structure than the long side, and, for the trapezoid of the cross-section of at least one of the back-side interconnects, the long side is closer to the second face of the back-side structure than the short side.

Example 10 provides the IC device according to example 9, where the first BEOL layer further includes first backend interconnects, in the plane that is substantially perpendicular to the bonding interface between the first IC structure and the second IC structure, a cross-section of at least one of the first backend interconnects is the trapezoid, and, for the trapezoid of the cross-section of at least one of the first backend interconnects, the short side is closer to the second face of the back-side structure than the long side.

Example 11 provides the IC device according to examples 9 or 10, where the second BEOL layer further includes second backend interconnects, in the plane that is substantially perpendicular to the bonding interface between the first IC structure and the second IC structure, a cross-section of at least one of the second backend interconnects is the trapezoid, and, for the trapezoid of the cross-section of at least one of the second backend interconnects, the long side is closer to the second face of the back-side structure than the short side.

Example 12 provides the IC device according to examples 9 or 10, where the second BEOL layer further includes second backend interconnects, in the plane that is substantially perpendicular to the bonding interface between the first IC structure and the second IC structure, a cross-section of at least one of the second backend interconnects is the trapezoid, and, for the trapezoid of the cross-section of at least one of the second backend interconnects, the short side is closer to the second face of the back-side structure than the long side.

Example 13 provides the IC device according to any one of examples 6-11, where the FEOL layer is a first FEOL layer, the second IC structure further includes a second FEOL layer, including further frontend transistors, and the second BEOL layer is closer to the first IC structure (or, phrased differently, closer to the bonding interface between the first and second IC structures, or closer to the back-side structure) than the second FEOL layer.

Example 14 provides the IC device according to any one of examples 6-10 and 12, where the FEOL layer is a first FEOL layer, the second IC structure further includes a second FEOL layer that includes further frontend transistors, and the second FEOL layer is closer to the first IC structure (or, phrased differently, closer to the bonding interface between the first and second IC structures, or closer to the back-side structure) than the second BEOL layer.

Example 15 provides the IC device according to any one of the preceding examples, where an individual one of the backend memory cells includes a TFT.

Example 16 provides the IC device according to any one of the preceding examples, where an individual one of the backend memory cells includes an access transistor and a capacitor.

Example 17 provides the IC device according to example 16, where the BEOL layer includes a first metal layer, a second metal layer, and a third metal layer; the second metal layer is between the first metal layer and the third metal layer; the first metal layer is between the FEOL layer and the second metal layer; a WL, coupled to the access transistor, is in the first metal layer; a channel region of the access transistor is in the second metal layer; and the capacitor is in the third metal layer.

Example 18 provides an IC package that includes an IC device according to any one of the preceding examples; and a further IC component, coupled to the IC device. For example, the IC device may include a frontend layer comprising frontend transistors that include fin-based transistors or nanoribbon transistors or nanowire transistors; a backend layer including backend memory cells, possibly coupled to the frontend transistors, where individual ones of the backend memory cells include TFTs; and a back-side power delivery structure, where the back-side power delivery structure includes back-side interconnects, where at least one of the back-side interconnects is electrically coupled to one or more of the backend memory cells, and where the FEOL layer is between the BEOL layer and the back-side power delivery structure.

Example 19 provides the IC package according to example 18, where the further IC component includes one of a package substrate, an interposer, or a further IC die.

Example 20 provides the IC package according to examples 18 or 19, where the IC device includes, or is a part of, at least one of a memory device, a computing device, a wearable device, a handheld electronic device, and a wireless communications device.

Example 21 provides an electronic device that includes a carrier substrate; and one or more of the IC device according to any one of the preceding examples and the IC package according to any one of the preceding examples, coupled to the carrier substrate.

Example 22 provides the electronic device according to example 21, where the carrier substrate is a motherboard.

Example 23 provides the electronic device according to example 21, where the carrier substrate is a PCB.

Example 24 provides the electronic device according to any one of examples 21-23, where the electronic device is a wearable electronic device (e.g., a smart watch) or handheld electronic device (e.g., a mobile phone).

Example 25 provides the electronic device according to any one of examples 21-24, where the electronic device further includes one or more communication chips and an antenna.

Example 26 provides the electronic device according to any one of examples 21-25, where the electronic device is an RF transceiver.

Example 27 provides the electronic device according to any one of examples 21-25, where the electronic device is one of a switch, a power amplifier, a low-noise amplifier, a filter, a filter bank, a duplexer, an upconverter, or a downconverter of an RF communications device, e.g., of an RF transceiver.

Example 28 provides the electronic device according to any one of examples 21-25, where the electronic device is a computing device.

Example 29 provides the electronic device according to any one of examples 21-28, where the electronic device is included in a base station of a wireless communication system.

Example 30 provides the electronic device according to any one of examples 21-28, where the electronic device is included in a user equipment device (i.e., a mobile device) of a wireless communication system.

Example 31 provides a method of fabricating an IC device. The method includes fabricating a frontend layer over a support structure that includes a semiconductor material, the frontend layer including frontend transistors, where a channel region of an individual one of the frontend transistors is a portion of the semiconductor material; fabricating a backend layer over the frontend layer, the backend layer including an array of memory cells, where an individual one of the memory cells includes a transistor and a capacitor; performing a back-side reveal by removing at least a portion of the support structure to expose at least portions of the frontend layer; and fabricating a back-side structure, including back-side interconnects, over the exposed frontend layer, where at least one of the back-side interconnects is electrically coupled to one or more of the memory cells of the backend layer.

Example 32 provides the method according to example 31, where the IC device includes a first IC structure and a second IC structure, where the first IC structure includes the frontend layer and the backend layer, and where the method further includes bonding the second IC structure to the first IC structure, and providing an after-bonding via that extends through all of the second IC structure, a bonding interface between the first IC structure and the second IC structure, through all of the first IC structure, and into the back-side structure to couple to the at least one of the back-side interconnects.

Example 33 provides the method according to example 32, where the bonding is performed after fabricating the back-side structure.

Example 34 provides the method according to example 32, where the bonding is performed before fabricating the back-side structure.

Example 35 provides the method according to any one of examples 31-34, further including processes for forming the IC device according to any one of the preceding examples (e.g., for forming the IC device according to any one of examples 1-17).

Example 36 provides the method according to any one of examples 31-35, further including processes for forming the IC package according to any one of the preceding examples (e.g., for forming the IC package according to any one of examples 18-20).

Example 37 provides the method according to any one of examples 31-36, further including processes for forming the electronic device according to any one of the preceding examples (e.g., for forming the electronic device according to any one of examples 21-30).

The above description of illustrated implementations of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize. These modifications may be made to the disclosure in light of the above detailed description.

The invention claimed is:
1. An integrated circuit (IC) device, comprising:
  a first IC structure, comprising:
    a first layer comprising transistors, and
    a second layer comprising memory cells;
  a second IC structure comprising a third layer comprising further memory cells; and
  a structure comprising interconnects, wherein:
    the first layer is between the second layer and the structure,
    the second layer is between the first layer and the third layer,
    at least one of the interconnects is coupled to one or more of the memory cells,
    at least one of the interconnects is coupled to one or more of the further memory cells, each of the first IC structure, the second IC structure, and the structure includes a first face and a second face opposite the first face, the IC device further includes a bonding interface between the first face of the second IC structure and the first face of the first IC structure, the IC device further includes a conductive via extending from the second face of the second IC structure to the at least one of the interconnects that is coupled to the one or more of the further memory cells, the first face of the structure is closer to the second face of the first IC structure than the second face of the structure, in a plane that is substantially perpendicular to the bonding interface, each of a cross-section of the conductive via and a cross-section of at least one of the interconnects is substantially a polygon having a first side and a second side substantially parallel to the first side and longer than the first side, for the polygon of the cross-section of the conductive via, the first side is closer to the second face of the structure than the second side, and for the polygon of the cross-section of at least one of the interconnects, the second side is closer to the second face of the structure than the first side.

2. The IC device according to claim 1, wherein the conductive via extends through the second IC structure, through the bonding interface, and into the first IC structure.

3. The IC device according to claim 1, wherein the at least one of the interconnects is coupled to the one or more of the further memory cells by being coupled to the conductive via and the conductive via being coupled to the one or more of the further memory cells.

4. The IC device according to claim 1, wherein the first face of the structure is closer to the bonding interface than the second face of the structure.

5. The IC device according to claim 1, wherein:
each of the first IC structure and the second IC structure includes a first face and a second face opposite the first face, the first IC structure includes first additional interconnects, the second IC structure includes second additional interconnects, in the plane that is substantially perpendicular to the bonding interface, each of a cross-section of at least one of the first additional interconnects and a cross-section of at least one of the second additional interconnects is substantially a polygon having a first side and a second side substantially parallel to the first side and longer than the first side, for the polygon of the cross-section of the at least one of the first additional interconnects, the first side is closer to the second face of the structure than the second side, and for the polygon of the cross-section of the at least one of the second additional interconnects, the second side is closer to the second face of the structure than the first side.

6. The IC device according to claim 5, wherein:
a direction of a taper of the conductive via is same as a direction of a taper of the at least one of the first additional interconnects and opposite to a direction of a taper of the at least one of the interconnects and to a direction of a taper of the at least one of the second additional interconnects.

7. The IC device according to claim 1, wherein:
each of the first IC structure and the second IC structure includes a first face and a second face opposite the first face, the first IC structure includes first additional interconnects, the second IC structure includes second additional interconnects, in the plane that is substantially perpendicular to the bonding interface, each of a cross-section of at least one of the first additional interconnects and a cross-section of at least one of the second additional interconnects is substantially a polygon having a first side and a second side substantially parallel to the first side and longer than the first side, for the polygon of the cross-section of the at least one of the first additional interconnects, the first side is closer to the second face of the structure than the second side, and for the polygon of the cross-section of the at least one of the second additional interconnects, the first side is closer to the second face of the structure than the second side.

8. The IC device according to claim 7, wherein:
a direction of a taper of the conductive via is opposite to a direction of a taper of the at least one of the interconnects and same as a direction of a taper of the at least one of the first additional interconnects and a direction of a taper of the at least one of the second additional interconnects.

9. The IC device according to claim 1, wherein the IC device is an IC package, and wherein the IC package further includes a component coupled to at least one of the first IC structure, the second IC structure, or the structure.

10. The IC device according to claim 9, wherein the component includes one of a package substrate, an interposer, or an IC die.

11. An integrated circuit (IC) device, comprising:
a first IC structure comprising a first layer comprising transistors and a second layer comprising memory cells;
a second IC structure comprising a third layer comprising further memory cells; and
a structure comprising interconnects, wherein:
the first layer is between the second layer and the structure,
the second layer is between the first layer and the third layer,
at least one of the interconnects is coupled to one or more of the memory cells,
at least one of the interconnects is coupled to one or more of the further memory cells,
each of the first IC structure, the second IC structure, and the structure includes a first face and a second face opposite the first face,
the IC device further includes a bonding interface between the first face of the second IC structure and the first face of the first IC structure,
the IC device further includes a conductive via extending from the second face of the second IC structure to the at least one of the interconnects that is coupled to the one or more of the further memory cells,
the first face of the structure is closer to the second face of the first IC structure than the second face of the structure,
in a plane that is substantially perpendicular to the bonding interface, each of a cross-section of the conductive via and a cross-section of at least one of the interconnects is substantially a trapezoid having a first side and a second side substantially parallel to the first side and longer than the first side, for the trapezoid of the cross-section of the conductive via, the first side is closer to the second face of the structure than the second side, and for the trapezoid of the cross-section of at least one of the interconnects, the second side is closer to the second face of the structure than the first side.

12. The IC device according to claim 11, wherein the first face of the structure is closer to the bonding interface than the second face of the structure.

13. The IC device according to claim 11, wherein:

each of the first IC structure and the second IC structure includes a first face and a second face opposite the first face, the first IC structure includes first additional interconnects, the second IC structure includes second additional interconnects, in the plane that is substantially perpendicular to the bonding interface, each of a cross-section of at least one of the first additional interconnects and a cross-section of at least one of the second additional interconnects is substantially a polygon having a first side and a second side substantially parallel to the first side and longer than the first side, for the polygon of the cross-section of the at least one of the first additional interconnects, the first side is closer to the second face of the structure than the second side, and for the polygon of the cross-section of the at least one of the second additional interconnects, the second side is closer to the second face of the structure than the first side.

14. The IC device according to claim 11, wherein:

each of the first IC structure and the second IC structure includes a first face and a second face opposite the first face, the first IC structure includes first additional interconnects, the second IC structure includes second additional interconnects, in the plane that is substantially perpendicular to the bonding interface, each of a cross-section of at least one of the first additional interconnects and a cross-section of at least one of the second additional interconnects is substantially a polygon having a first side and a second side substantially parallel to the first side and longer than the first side, for the polygon of the cross-section of the at least one of the first additional interconnects, the first side is closer to the second face of the structure than the second side, and for the polygon of the cross-section of the at least one of the second additional interconnects, the first side is closer to the second face of the structure than the second side.

15. The IC device according to claim 11, wherein the IC device is an IC package, and wherein the IC package further includes a component coupled to at least one of the first IC structure, the second IC structure, or the structure.

16. The IC device according to claim 15, wherein the component includes one of a package substrate, an interposer, or an IC die.

17. An integrated circuit (IC) device, comprising:

an IC structure comprising a first layer comprising transistors and a second layer comprising memory cells; and a structure comprising interconnects, wherein:

the first layer is between the second layer and the structure, at least one of the interconnects is coupled to one or more of the memory cells, the IC structure further includes additional interconnects, each of the IC structure and the structure includes a first face and a second face opposite the first face, the first face of the IC structure is closer to the second face of the structure than the second face of the IC structure, the second face of the structure is closer to the second face of the IC structure than the first face of the structure, the IC device further includes a conductive via extending from the second face of the IC structure to the at least one of the interconnects that is coupled to one or more of the memory cells, and in a cross-section of the IC device in a plane that is substantially perpendicular to the first layer, the conductive via tapers in a direction from the second face of the structure to the first face of the structure and at least one of the interconnects tapers in a direction opposite to the direction from the second face of the structure to the first face of the structure.

18. The IC device according to claim 17, wherein, in the cross-section of the IC device in the plane that is substantially perpendicular to the first layer, at least one of the additional interconnects tapers in the direction from the second face of the structure to the first face of the structure.

19. The IC device according to claim 17, wherein the IC device is an IC package, and wherein the IC package further includes a component coupled to at least one of the IC structure or the structure.

20. The IC device according to claim 19, wherein the component includes one of a package substrate, an interposer, or an IC die.

* * * * *